(12) United States Patent
Kondoh

(10) Patent No.: US 7,812,246 B2
(45) Date of Patent: *Oct. 12, 2010

(54) THERMOELECTRIC EFFECT DEVICE, ENERGY DIRECT CONVERSION SYSTEM, AND ENERGY CONVERSION SYSTEM

(75) Inventor: Yoshiomi Kondoh, 694-3, Komagata-machi, Maebashi-shi, Gunma 379-2122 (JP)

(73) Assignees: Kabushiki Kaisha Meidensha, Tokyo (JP); Yoshiomi Kondoh, Maebashi-shi (JP)

( * ) Notice: Subject to any disclaimer, the term of this patent is extended or adjusted under 35 U.S.C. 154(b) by 1020 days.

This patent is subject to a terminal disclaimer.

(21) Appl. No.: 10/727,988

(22) Filed: Dec. 5, 2003

(65) Prior Publication Data

US 2004/0226599 A1   Nov. 18, 2004

Related U.S. Application Data

(63) Continuation-in-part of application No. PCT/JP02/05679, filed on Jun. 7, 2002.

(30) Foreign Application Priority Data

Jun. 7, 2001   (JP)   ............................. 2001-172963

(51) Int. Cl.
*H01L 35/28* (2006.01)
(52) U.S. Cl. ....................................... 136/211; 136/212
(58) Field of Classification Search ................. 136/211, 136/212
See application file for complete search history.

(56) References Cited

U.S. PATENT DOCUMENTS 5,006,178 A * 4/1991 Bijvoets ...................... 136/211

| | | | |
|---|---|---|---|
| 5,515,683 A | 5/1996 | Kessler | |
| 5,987,891 A * | 11/1999 | Kim et al. ...................... | 62/3.6 |
| 6,100,600 A * | 8/2000 | Pflanz .......................... | 290/54 |

(Continued)

FOREIGN PATENT DOCUMENTS

JP   51-016284   2/1976

(Continued)

OTHER PUBLICATIONS

Office Action in U.S. Appl. No. 10/537,357, dated Jan. 8, 2010 (10 pgs).

(Continued)

*Primary Examiner*—Jeffrey T Barton
(74) *Attorney, Agent, or Firm*—Foley & Lardner LLP

(57) ABSTRACT

There is provided a self driving energy direct conversion system capable of restricting global warming by using a recycle-type and open-system thermoelectric effect device which uses a natural heat energy (reusable, non polluting, and omnipresent) and which is capable of obtaining an energy source. With a group of Peltier effect elements separated at a certain distance and a group of Seebeck effect elements separated at a certain distance, a heat energy transfer section, a power generator section, and an electrolysis section are provided. Making artificially a heat energy transfer, an electric potential energy conversion, and a chemical potential energy source (of a hydrogen gas and an oxygen gas) allows use of the heat energy, an electric power and a chemical potential energy. Hereinabove, the chemical potential energy source is made by a water electrolysis circuit using water that is easy to pressurize, compress, store, accumulate and convey.

12 Claims, 15 Drawing Sheets

U.S. PATENT DOCUMENTS 6,271,459 B1 * 8/2001 Yoo .......................... 136/201
2003/0230332 A1 * 12/2003 Venkatasubramanian et al. . 136/205

FOREIGN PATENT DOCUMENTS

| JP | 57-017401 A | 1/1982 |
|---|---|---|
| JP | 57-29171 U | 2/1982 |
| JP | 58-173876 A | 10/1983 |
| JP | 60-035182 A | 2/1985 |
| JP | 61-284976 A | 12/1986 |
| JP | 1-214280 A | 8/1989 |
| JP | 4-192380 A | 7/1992 |
| JP | 06-177437 A | 6/1994 |
| JP | 08-501658 A | 2/1996 |

OTHER PUBLICATIONS

Office Action in U.S. Appl. No. 10/537,357, dated Feb. 23, 2009 (11 pgs).

Office Action in U.S. Appl. No. 10/537,357, dated May 13, 2009 (6 pgs).

Office Action in U.S. Appl. No. 10/537,357, dated May 26, 2009 (6 pgs).

Office Action received in U.S. Appl. No. 10/537,357, dated Jul. 8, 2010 (8 pgs.).

* cited by examiner

THERMOELECTRIC EFFECT DEVICE, ENERGY DIRECT CONVERSION SYSTEM, AND ENERGY CONVERSION SYSTEM

The present application is a continuation-in-part application of PCT/JP02/05679 filed Jun. 7, 2002, which claims priority of Japanese Patent Application No. 2001-172963 filed Jun. 7, 2001, the entire contents of both applications are incorporated herein by reference.

TECHNICAL FIELD

The present invention relates to a device and a system for mutually converting energies in different forms or for transferring a heat energy. Especially, the present invention relates to a thermoelectric effect device, an energy direct conversion system and an energy conversion system which convert a natural heat energy directly into an electric potential energy or a chemical potential energy or which transfer the heat energy.

BACKGROUND TECHNIQUE

Mostly, present forms of using energy include a chemical fuel, an atomic power, a hydraulic power and the like, which forms are not reversible. Especially, consumption of the chemical fuel is a cause for accelerating global warming as well as environmental disruption. An effort of consuming what is called a clean energy including a sun light generation, a wind power generation and hydrogen gas for decreasing load on the environment is more and more realized for a while, however, not to such an extent as to allow the clean energy to replace the chemical fuel or the atomic power.

A thermoelectric converter element using the Seebeck effect (hereinafter referred to as "Seebeck element") is known for its ability to convert a natural heat energy into an electric power and the like which is directly usable. The Seebeck element is under research and development for replacing the chemical fuel or the atomic power. The Seebeck element is so constituted as to allow a contact of two conductors (or semiconductors) having different Seebeck coefficients from each other. Difference in the number of free electrons in the two conductors may move electrons, thus causing a potential difference between the two conductors. Applying the heat energy to the above contact may activate movement of the free electrons, thus converting the heat energy into the electric potential energy, which is referred to as "thermoelectric effect."

DISCLOSURE OF THE INVENTION

A direct generation element such as the Seebeck element is, however, not capable of causing a sufficient electric power. In other words, the Seebeck element can be used only for a small energy source, thereby limiting its application.

In general, the above Seebeck element is of an integrated type integrating a heating section with a cooling section. In addition, a thermoelectric effect element using the Peltier effect (hereinafter referred to as "Peltier element") is also of an integrated type integrating an endothermic section with an exothermic section.

With this, constituting a large scale energy conversion equipment using the Peltier element and the Seebeck element as descried above is not realistic due to physical restriction of place for installing the equipment and the like. Use of the energy with the general Peltier element and the general Seebeck element is one directional. In other words, constituting a recycle of using once-used energy was not included in technical concept.

The above energy development is preferably expected to achieve reuse of the energy without causing the global warming and the environmental disruption, which is an issue indispensable for the future energy development.

An object of the present invention is to solve the above issue, and to provide the following: the thermoelectric effect device, the energy direct conversion system, and the energy conversion system for obtaining various energies including the heat energy, the electric potential energy, the chemical potential energy and the like, by using (or reusing) the natural heat energy which is free from causing environmental pollution and is omnipresent.

The system for obtaining the energy source for meeting the above object is expected to be thermally open and in a form of recycle. More specifically, between regions having a certain distance, the present invention provides an electric circuit system achieving the following: The heat energy is transferred by the Peltier effect element. The thus transferred heat energy is converted directly into the electric potential energy by a Seebeck effect element. Moreover, the electric potential energy is converted into the chemical potential energy by electrolyte, water electrolysis and the like, so as to store, accumulate and convey the energy with ease.

Eliminating, for example, the chemical fuel and the like, the present invention can effectively use the natural heat energy and reuse the same. Moreover, the present invention can convert the heat energy into the electric potential energy for use as electric power and convert the electric potential energy into the chemical potential energy, thus constituting an open energy recycle system. With this, the present invention can contribute to deceleration of the global warming, and bring about the energy direct conversion system free from an environmental load which may cause the environmental pollution.

BEST MODE OF CARRYING OUT THE INVENTION

Described Next is a Mode of Carrying out the Invention.

As disclosed in the above DISCLOSURE OF THE INVENTION, the Seebeck effect (or the Peltier effect) has a problem attributable to the integrated type integrating the heating section with the cooling section (or integrating the endothermic section with the exothermic section). For solving the above problem, therefore, the inventor noticed a separation of the Seebeck element (or the Peltier element), namely, separating the heating section (endothermic section) from the cooling section (exothermic section). The inventor had an experiment for verifying whether the heating section and the cooling section (endothermic section and exothermic section) can be separated from each other, namely, can be so constituted as to become independent in constitution of each other, without losing characteristic of the Seebeck element (or the Peltier element).

Hereinafter described referring to drawings and the like are details on a thermoelectric effect device, an energy direct conversion system, and an energy conversion system, according to the mode of carrying out the invention. According to the mode of carrying out the invention, an entirety of the energy direct conversion system using natural energy operates in an open system. Therefore, "the entropy increase law that can be established only in a closed system" is not applicable to the energy direct conversion system, according to the mode of carrying out the invention.

Figure 1:
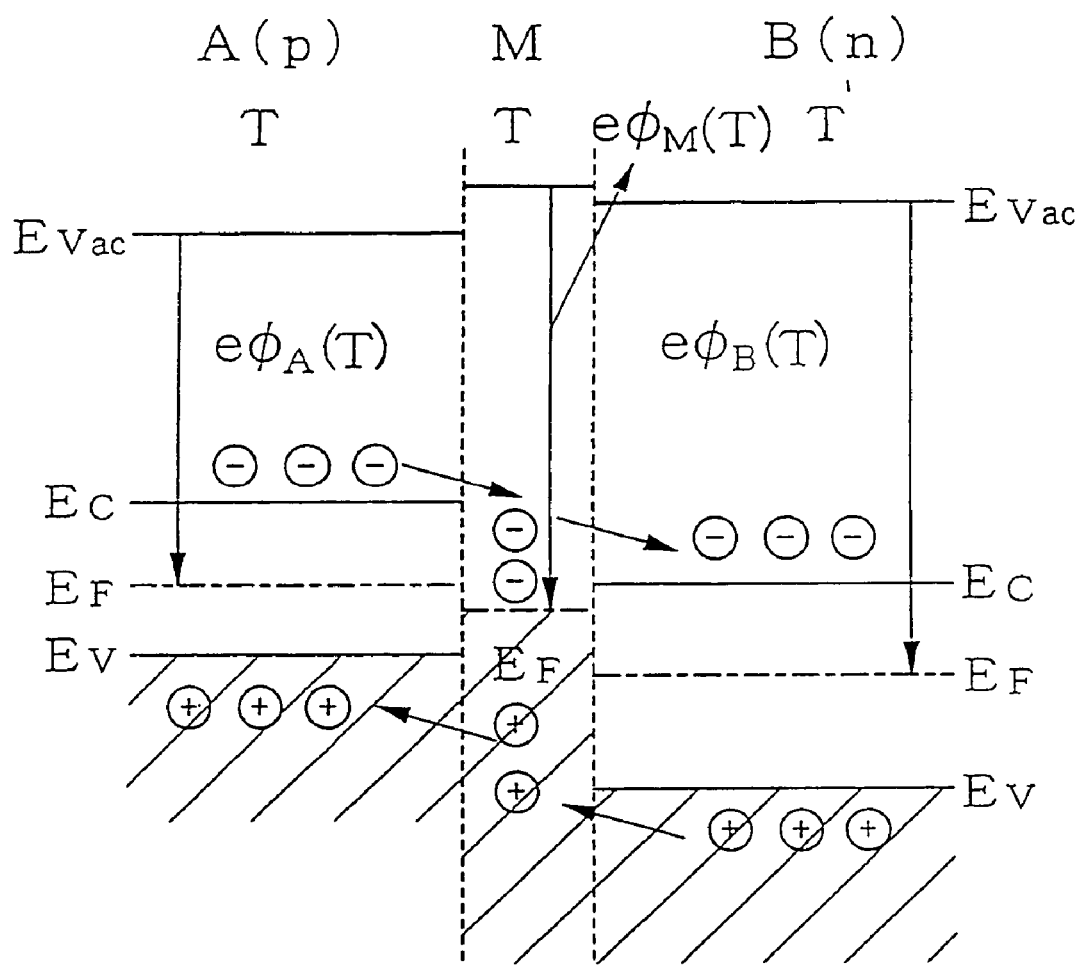
FIG. 1 shows a schematic model for explaining, referring to an energy band, a principle of physical mechanism of the Peltier effect and the Seebeck effect.

Described at first is a fundamental technical concept (principle) of the present invention. FIG. 1 shows a schematic model for explaining, referring to an energy band, a principle of physical mechanism of the Peltier effect and the Seebeck effect. More specifically about this: FIG. 1 shows a conductor member A (for example, p type semiconductor in FIG. 1; hereinafter referred to as "first electric conductor member A") and a conductor member B (for example, n type semiconductor in FIG. 1; hereinafter referred to as "second electric conductor member B") which have different Seebeck coefficients from each other. In FIG. 1, a joint member M made of a metal and the like having an electric conductivity is intervened between the first electric conductor member A and the second electric conductor member B. An external electric field is applied from the second electric conductor member B to the first electric conductor member A. In FIG. 1, an inclined line shows a charged electron band without a free electron, a one-dot chain lines shows an Fermi level EF, a sign EV shows an upper end level of the charged electron band, a sign EC shows a lower end level of an electric conduction band, and a sign EVac shows a vacuum level.

As is seen in FIG. 1, applying the external electric field from the second electric conductor member B to the first electric conductor member A may cause the following level arrangement: a] the Fermi level EF of the first electric conductor member A, b] the Fermi level EF (lower than a] above) of the joint member M having a finite thickness, and c] the Fermi level EF (lower than b] above) of the second electric conductor member B. Refraining from the application of the external electric field may cause an equality to the Fermi level EF of the first electric conductor member A, the Fermi level EF of the joint member M, and the Fermi level EF of the second electric conductor member B. Moreover, applying the external electric field from the first electric conductor member A to the second electric conductor member B may cause a level arrangement (the Fermi level EF of the first electric conductor member A, the Fermi level EF of the joint member M, and the Fermi level EF of the second electric conductor member B) which is opposite to that shown in FIG. 1.

In FIG. 1, each of a sign $\phi A$ (T), a sign $\phi M$ (T), and a sign $\phi B$ (T), respectively, shows an electric potential (barrier potential) of one of the first electric conductor member A, the joint member M, and the second electric conductor member B. Irrespective of the direction of the external electric field, each of the electric potential $\phi A$ (T), the electric potential $\phi M$ (T), and the electric conductor member A, the joint member M, and the second electric conductor member B respectively. More specifically about this is described as below: Ousting an electron (having an electric charge e) from the first electric conductor member A, the joint member M and the second electric conductor member B is expected to be, respectively, in need of an energy $e\phi A$ (T), an energy $e\phi M$ (T), and an energy $e\phi B$ (T).

As described above, refraining from the application of the external electric field may move the electron in such a manner as to cause the equality to the Fermi level EF of the first electric conductor member A, the Fermi level EF of the joint member M, and the Fermi level EF of the second electric conductor member B, thus bringing about a contact potential difference $V_{BM}=\phi B$ (T)$-\phi M$ (T) between the second electric conductor member B and the joint member M, and a contact potential difference $V_{MA}=\phi M$ (T)$-\phi A$ (T) between the joint member M and the first electric conductor member A. With the external electric field applied from the second electric conductor member B to the first electric conductor member A, in this state, each of a free electron of the electric conduction band and an electron caused by movement of hole in the charged electron band flows from the first electric conductor member A to the joint member M, and then flows from the joint member M to the second electric conductor member B. Herein, a drift speed of the free electron caused by the external electric field is ignorably small, compared with heat speed of the free electron.

Hereinabove, paying attention to a group of the free electrons flowing from the first electric conductor member A to the joint member M and then flowing from the joint member M to the second electric conductor member B leads to a finding that an entire energy of each of the above free electrons is equivalent to a total of an electric potential energy and a kinetic energy which is attributable to the heat speed. The above paid-attention group of the free electrons flowing from the first electric conductor member A to the joint member M causes a first physical process, and the above paid-attention group of the free electrons then flowing from the joint member M to the second electric conductor member B causes a second physical process. Having sufficiently narrow contact areas, respectively, the first physical process and the second physical process may become an electronic heat insulation process in which the paid-attention group of the electrons is free from application of an external energy.

More specifically about this: The paid-attention group of the electrons flowing from the first electric conductor member A to the joint member M and then flowing from the joint member M to the second electric conductor member B may decrease heat energy of the electron, thus decreasing the heat speed of the electron flowing into each of boundaries (In FIG. 1, two boundaries). Hereinabove, the heat energy of the electron may be decreased by an amount equal to an increase in the electric potential energy of the electron on each of the boundaries. The heat speed (decreased on each of the boundaries) of the paid-attention group of the electrons can absorb at quite a quick energy equal-distribution time the heat energy from free electron group and electric conduction material's atom which were present in advance in the joint member M and the second electric conductor member B. The above absorption may cause an endothermic phenomenon to the vicinity of a boundary on the first electric conductor member A's side of the joint member M and a boundary on the joint member M's side of the second electric conductor member B. The above physical process is defined as the physical mechanism causing the endothermic phenomenon by the Peltier effect. Herein, the above endothermic phenomenon may not occur to the vicinity of a boundary on the joint member M's side of the first electric conductor member A and a boundary on the second electric conductor member B's side of the joint member M.

Next, reversing the direction of current flow by reversing the external electric field (in other words, applying the external electric field from the first electric conductor member A to the second electric conductor member B) may cause the following level arrangement opposite to FIG. 1: a] the Fermi level EF of the first electric conductor member A, b] the Fermi level EF (higher than a] above) of the joint member M having the finite thickness, and c] the Fermi level EF (higher than b] above) of the second electric conductor member B. Each of the electric potential $\phi A$ (T) of the first electric conductor member A, the electric potential $\phi M$ (T) of the joint member M, and the electric potential $\phi B$ (T) of the second electric conductor member B is to be determined inherently, as described above, based on the temperature of one of the first electric conductor member A, the joint member M, and the second electric conductor member B respectively. Therefore, relative difference in electric potential among the above three may remain unchanged, with the direction of the electron flow reversed.

As a result, the kinetic energy on each of the boundaries may be increased by an amount equal to the decrease in the electric potential energy of the electron, thus increasing the heat speed of the electron flowing into each of the boundaries, and further thus causing an exothermic phenomenon to the vicinity of the boundary on the second electric conductor member B's side of the joint member M and the boundary on the joint member M's side of the first electric conductor member A. Herein, the above exothermic phenomenon may not occur to the vicinity of the boundary on the joint member M's side of the second electric conductor member B and the boundary on the first electric conductor member A's side of the joint member M.

Causing the electric flow may be in need of a closed circuit. A general Peltier element has the above constitution in which the first electric conductor member A (T), the joint member M (T), and the second electric conductor member B (T) are connected, with the joint member M (having a small absolute Seebeck coefficient) intervened between the first electric conductor member A and the second electric conductor member B. Using an external electric power source for the current flow in the above constitution may constitute a Peltier element circuit. The greater the difference in the absolute Seebeck coefficient between the first electric conductor member A and the second electric conductor member B, the more increased the exothermic value or the endothermic value by the Peltier effect. The above absolute Seebeck coefficient is inherent in the electric conductor member that is dependent on temperature.

The Peltier element circuit having the above closed circuit may be in need of eliminating the exothermic energy on an exothermic side by using a sufficiently large heat radiator member (namely, a member having a high heat radiation effect). Otherwise, the three electric conduction bands, including the first electric conductor member A (T), the joint member M (T), and the second electric conductor member B (T) in FIG. 1 featuring good thermal conductivity may have extremely high temperature equally.

As a result, a large amount of the electrons of the charged electron band may be thermally excited to the electric conduction bands, thus greatly increasing the Fermi level EF, resulting in equation of electric potentials among the three electric conduction bands, namely, "$\phi A$ (T)=$\phi M$ (T)=$\phi B$ (T)." In this state, the Peltier effect described in the above explanation about its principle may be extinguished, thereby, an electric power applied from an external section may be spent only for heating (Joule) electric resistance of the three electric conduction bands. For avoiding the above state, a generally-used home electric appliance or computer incorporating therein the Peltier element circuit is constitutionally provided with a large thermal absorbent, a heat radiation material or an electric fan on the exothermic side of the Peltier effect element (namely, in the vicinity of the exothermic side). With the above constitutional provision, the Peltier effect may not be extinguished.

Contrary to the above, under the present invention, using an electric conduction material (for example, two wiring materials) featuring good electrical characteristics (for example, thermal conductivity or electrical conductivity) for causing a thermally open system to the Peltier element with the exothermic side separated from an endothermic side (namely, securing a certain distance which may keep the exothermic side and the endothermic side free from a mutual thermal interference) allows the exothermic side and the endothermic side to become independent of each other. With the above constitution, the Peltier effect may not be extinguished by any means, and may be usable.

With the above constituted Peltier element in a state free from application of the external electric field in FIG. 1, the higher the temperature T is, the larger the number of free electrons (attributable to heat excitation) of the electric conduction band and the number of holes (attributable to heat excitation) of the charged electron band are. As a result, a larger number of electrons may move such that the Fermi level EF on the first electric conductor member A's side, the Fermi level EF of the joint member M, and the Fermi level EF on the second electric conductor member B's side may become substantially equal, thus increasing a contact potential difference $V_{AM}$ between the first electric conductor member A and the joint member M, namely, $V_{AM}=e\phi A$ (T)$-e\phi M$ (T).

As described above, refraining from the application of the external electric field and connecting in line the two constitutions in FIG. 1, namely, connecting electrically in-line 'a unit constituted of the first electric conductor member A ($T_\alpha$)' and the second electric conductor member B ($T_\alpha$)' and 'a unit constituted of the first electric conductor member A ($T_\beta$) and the second electric conductor member B ($T_\beta$)' by a continuous conductor may increase an in-line potential difference voltage V in accordance with an increase in temperature difference '$T_\alpha - T_\beta$.' The in-line potential difference voltage V corresponds to an output voltage by the Seebeck effect.

Under the present invention, the two units each of which is constituted of the two conductor members having the Seebeck coefficients different from each other are joined by the electric conduction material. With the above constitution, the Peltier effect flowing the current with the external electric field and the Seebeck effect forming the in-line connection of the contact potential difference without the external electric field are the same with each other in terms of physical base. Namely, the Peltier effect and the Seebeck effect under the present invention are for applying two sides of the same physical mechanism.

[First Mode of Carrying Out]

Figure 2:
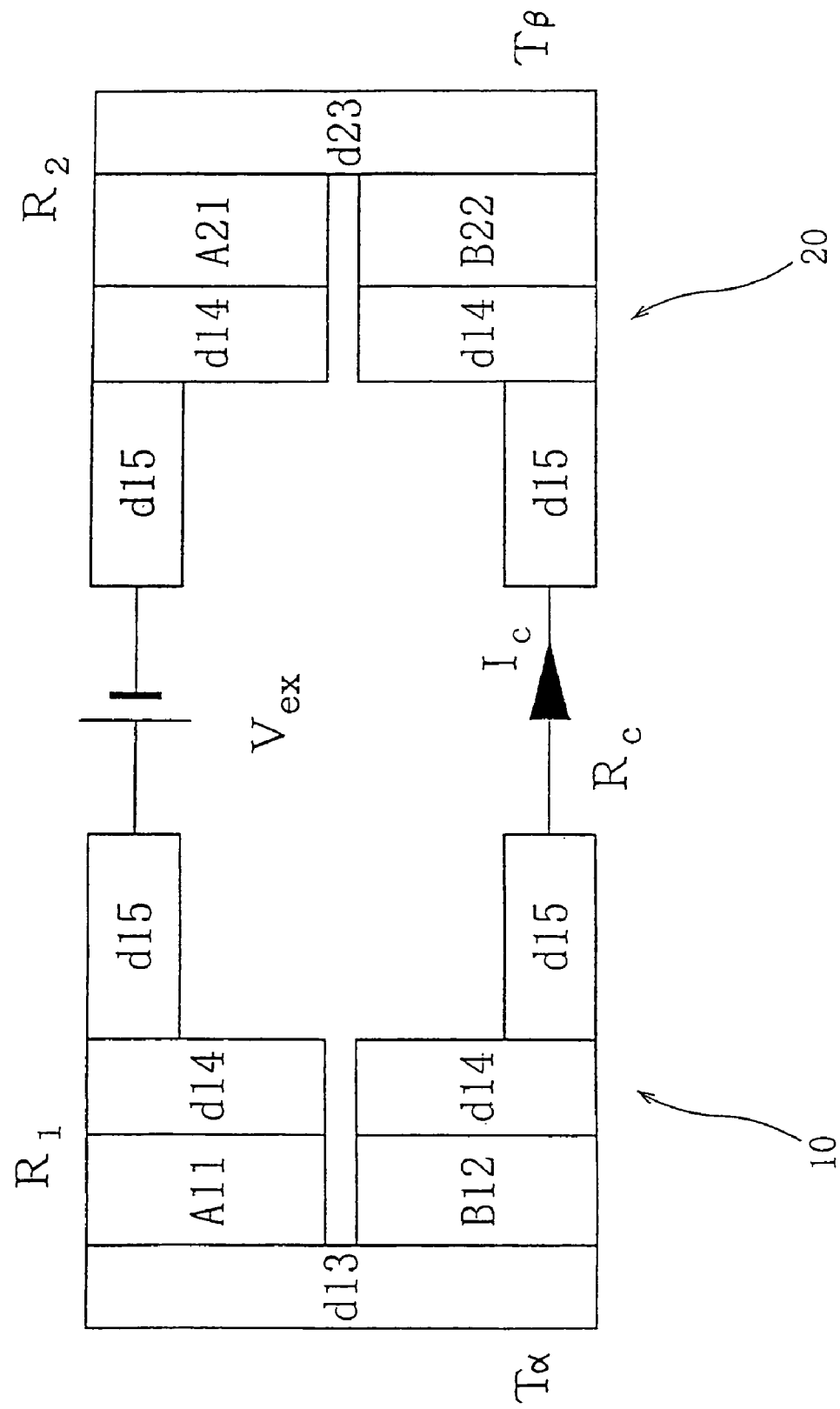
FIG. 2 shows a schematic for explaining a pair of Peltier effect heat transfer circuit systems capable of setting up a certain distance, according to a first mode of carrying out.

FIG. 2 relates to a first mode of carrying out. FIG. 2 shows a schematic for explaining a pair of Peltier effect heat transfer circuit systems capable of setting up a certain distance between two thermoelectric converter elements, As is seen in FIG. 2, a first electric conductor member A11 and a second electric conductor member B12 which have different Seebeck coefficients from each other are joined via a joint member d13 made of a material (for example, copper, gold, platinum, aluminum and the like) featuring good thermal conductivity and good electric conductivity, thus forming a first thermoelectric converter element 10. Like the first thermoelectric converter element 10, a first electric conductor member A21 and a second electric conductor member B22 which have different Seebeck coefficients from each other are joined via a joint member d23, thus forming a second thermoelectric converter element 20. Moreover, by way of electric conduction materials (for example, wiring materials made of copper, gold, platinum, aluminum and the like) featuring good thermal conductivity, the first electric conductor member A11's side opposite to the joint member d13 and the second electric conductor member B12's side opposite to the joint member d13 are connected, respectively, to the first electric conductor member A21's side opposite to the joint member d23 and the second electric conductor member B22's side opposite to the joint member d23. Connecting a part of the above electric conduction material (for example, a middle section of one of the electric conduction materials) to a direct current in-line may constitute a pair of the Peltier effect heat transfer circuit systems with the joint member d13 on the endothermic side and the joint member d23 on the exothermic side.

The above electric conduction material may be in need of having such a length as to keep the first thermoelectric converter element 10 and the second thermoelectric converter element 20 at least free from the mutual thermal interference. Theoretically, setting the above length is variable from several microns (minor) to several hundred kilometers or over.

The Peltier effect heat transfer circuit system thus constituted is capable of using the endothermic section (namely, a negative heat energy source) and the exothermic section (namely, a positive heat energy source) which are independent of each other at a certain distance therebetween.

Concerning the connection between the thermoelectric converter elements by means of the electric conduction material: Connecting the electric conduction material directly to the electric conductor member is allowed, wherever is possible. If necessary, an electric conduction plate d14 (for example, copper, gold, platinum, aluminum and the like) in FIG. 2 (and FIG. 7) may be used for the connection. Moreover, connecting a terminal d15 (for example, copper, gold, platinum, aluminum and the like) to the electric conduction plate d14 is allowed. Moreover, shown in FIG. 2 (and FIG. 7) includes: a resistance R1 and a resistance R2 of the electric conductor members, respectively, on the endothermic side and the exothermic side, or a high temperature side and a low temperature side; a circuit current IC; a circuit resistance Rc of a section for connecting the electric conduction materials; an external direct current source Vex; and a voltage output Vout. The signs used above are also to be used likewise in the following mode for carrying out and embodiment.

At first, in a circuit so constituted as is seen in FIG. 2, a general π-shaped pn junction element (for example, CP-249-06L and CP2-8-31-08L made by MeLCOR in the United States) is used for the first electric conductor member A11 and the second electric conductor member B12, likewise, a general π-shaped pn junction element is used for the first electric conductor member A21 and the second electric conductor member B22. A distance {length of the electric conduction material (copper)} between the first thermoelectric converter element 10 and the second thermoelectric converter element 20 is set at one of 1 m and 50 m. In this state, supplying a current from the external direct current source caused the endothermic phenomenon and the exothermic phenomenon (which are caused by the Peltier effect) to ends of the two π-shaped pn junction elements (ends of both the first thermoelectric converter element 10 and the second thermoelectric converter element 20, namely, the joint member d13 and the joint member d23). The first thermoelectric converter element 10 (endothermic side) and the second thermoelectric converter element 20 (exothermic side) so constituted as to be independent of each other were verified to keep the Peltier effect. Reversing direction of the supplied current was verified to reverse the endothermic phenomenon (at one end) with the exothermic phenomenon (at the other end).

Figure 3:
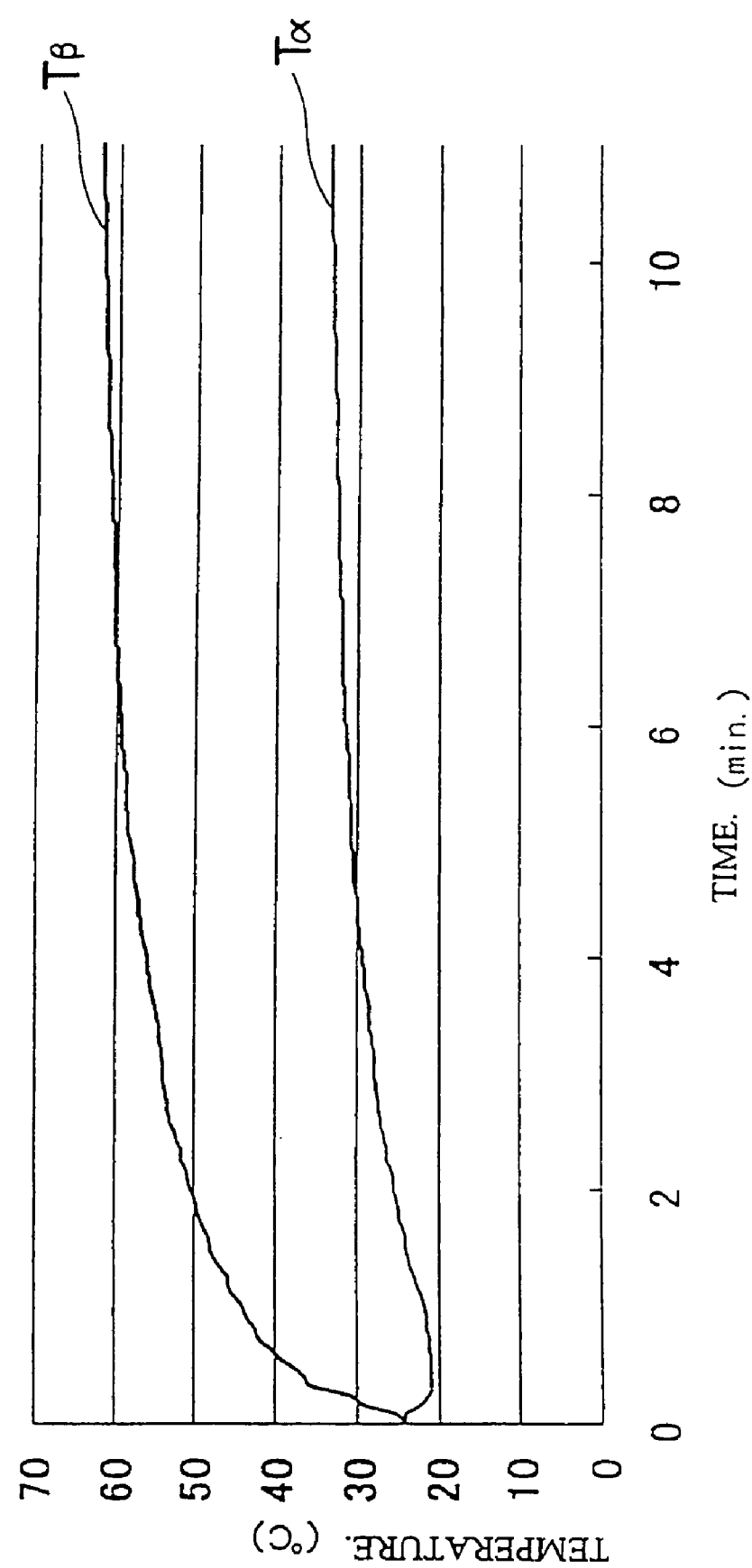
FIG. 3 shows a temperature change relative to a time change by the Peltier effect.
Figure 4:
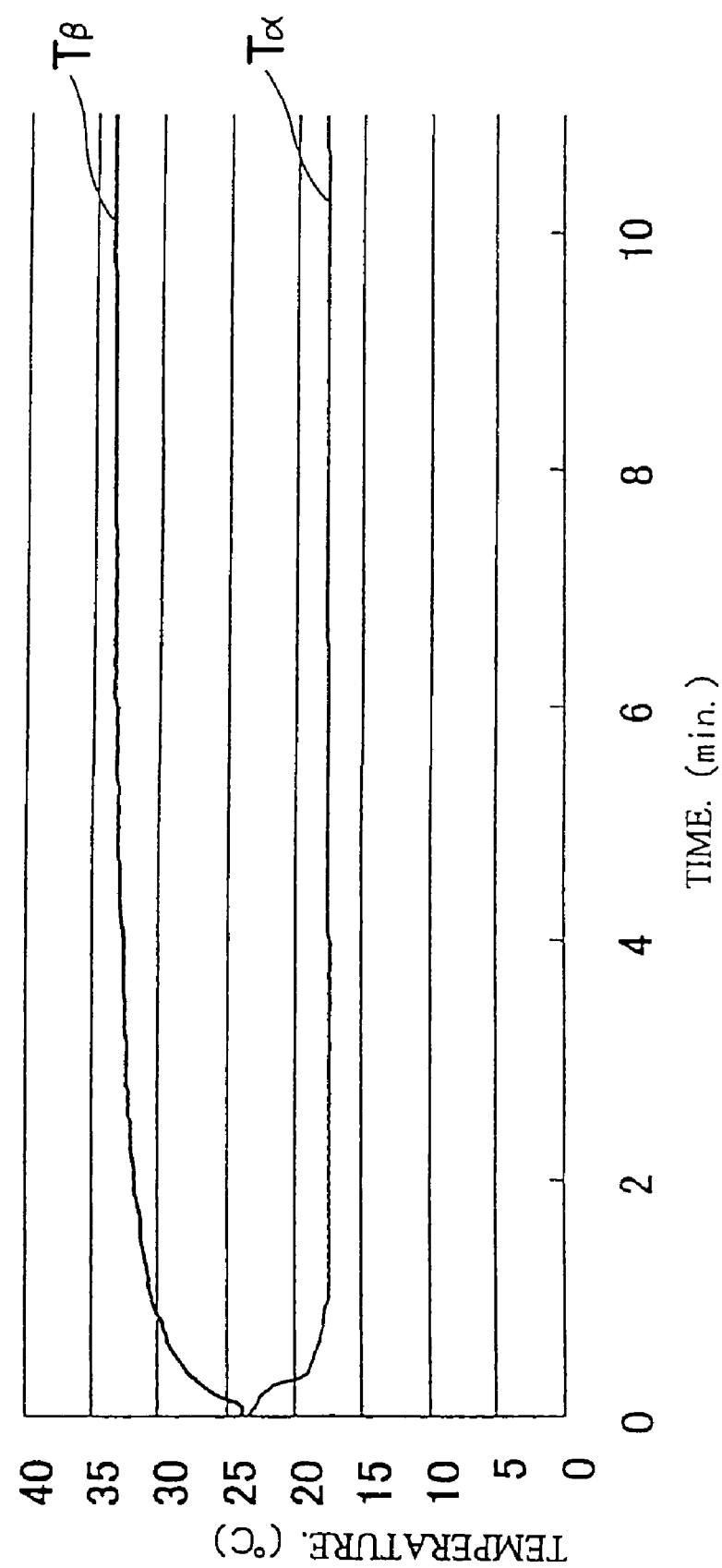
FIG. 4 shows a temperature change relative to a time change by the Peltier effect.

Next, supplying the current from the external direct current source in FIG. 2 with the distance of 5 mm between the first thermoelectric converter element 10 and the second thermoelectric converter element 20 showed a thermal transfer from the second thermoelectric converter element 20 to the first thermoelectric converter element 10, as is seen in FIG. 3, thus gradually increasing the temperature $T_\alpha$ on the first thermoelectric converter element 10. The distance of 2 m between the first thermoelectric converter element 10 and the second thermoelectric converter element 20 showed no thermal transfer from the second thermoelectric converter element 20 to the first thermoelectric converter element 10, as is seen in FIG. 4, thus keeping the first thermoelectric converter element 10 and the second thermoelectric converter element 20 free from the mutual thermal interference. As a result, the circuit in FIG. 2 is dependent on an external heat energy drop.

Figure 5:
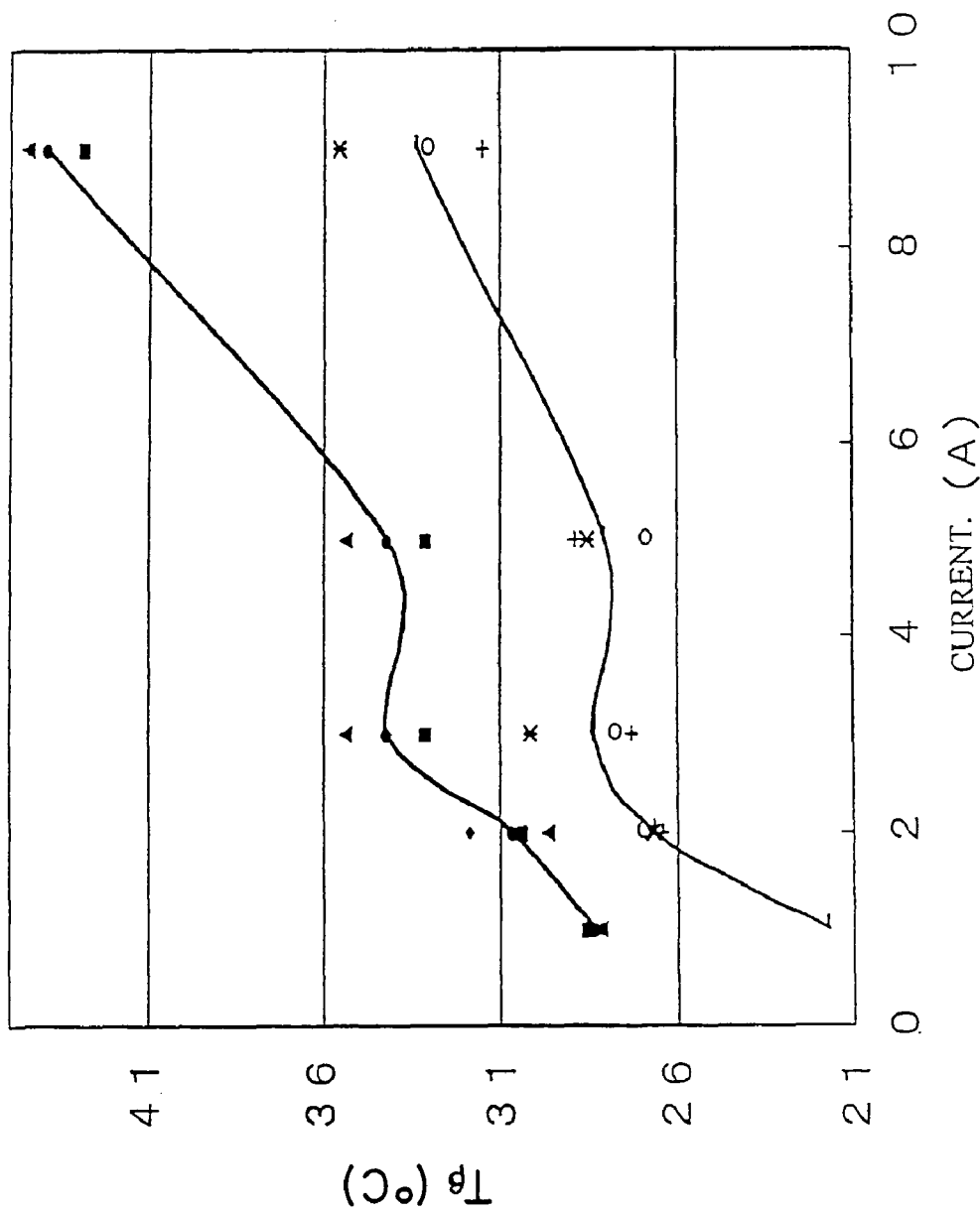
FIG. 5 shows a temperature change relative to a current change.

Next, in a state that the temperature $T_\alpha$ on the first thermoelectric converter element 10 and a temperature $T_\beta$ on the second thermoelectric converter element 20 in the circuit in FIG. 2 are in equilibrium, an external heat source was used for artificially heating (three times) the first thermoelectric converter element 10 by 10° C. (increased). Then, temperature (° C.) and a temperature change $\Delta T_\beta$ (° C.) on the second thermoelectric converter element 20's side were measured, relative to current change of the external heat source. As a result, FIG. 5 shows that the larger the current from the external direct current source is, the more increased the temperatures are before and after the above artificial heatings and the more increased the temperature difference is between before and after the above artificial heatings. With this result, the heat transfer is variable corresponding to a scale of the heat energy from the first thermoelectric converter element 10, In FIG. 5, a mark ♦ is measurement after a first heating, a mark ■ is measurement after a second heating, a mark ▲ is measurement after a third heating, a mark * is a measurement before a first heating, a mark ○ is measurement before a second heating, a mark + is measurement before a third heating, a mark ● is a mean of the measurements before the first, second and third heatings, and a mark – is a mean of the measurements after the first, second and third heatings.

Figure 6:
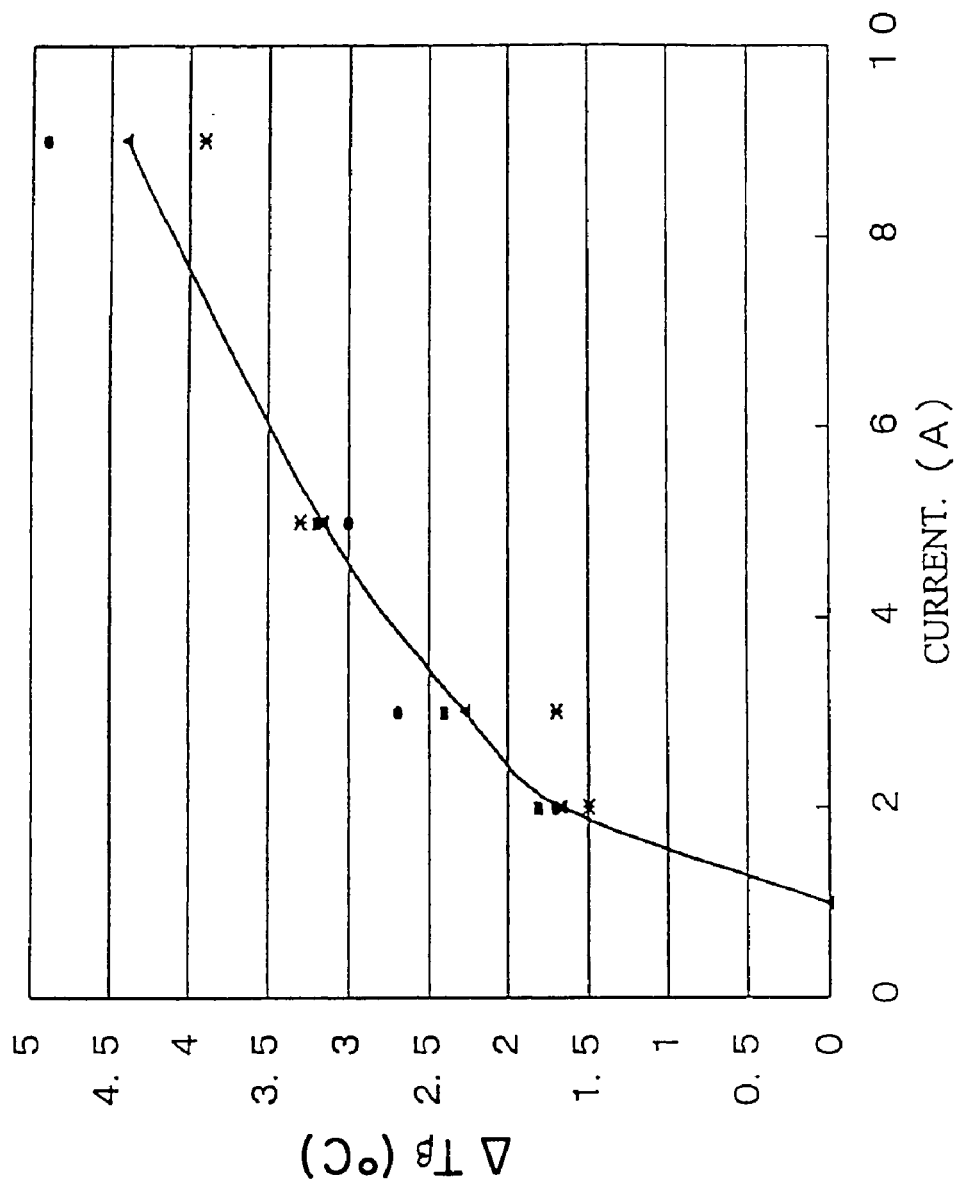
FIG. 6 shows an amount of the temperature change relative to the current change.

As is seen in FIG. 6, the larger the current of the external direct current source is, the greater the temperature change $\Delta T_\beta$ becomes. In FIG. 6, a mark * is temperature difference between after and before the first heating, a mark ● is temperature difference between after and before the second heating, a mark ■ is temperature difference between after and before the third heating, and a mark ▲ is a mean of the temperature differences between after and before the heatings above.

In connection with the heat energy transfer, the circuit in FIG. 2, therefore, has dependence on the external heat energy drop (temperature) and on the current. The larger the current is, the larger the heat transfer becomes. More specifically, the heat energy transferred from the temperature $T_\alpha$ side to the temperature $T_\beta$ side (what is called a heat pumping with the in-conductor free electron) can prove a principle that the in-conductor free electron can carry out the heat energy transfer. Moreover, the heat energy transfer is dependent on the current, namely, the larger the current is the larger the heat energy transfer is.

In connection with the temperature dependence: Securing the distance for keeping at least $T_\alpha < T_\beta$ can bring about the Peltier effect. The thus secured distance is, however, preferable such that the first thermoelectric converter element 10 and the second thermoelectric converter element 20 are kept free from the mutual thermal interference. For example, provided that the first thermoelectric converter element 10 and the second thermoelectric converter element 20 are kept at least free from the mutual thermal interference, the distance of the electric conduction material can theoretically be set at several microns (minor) to several hundred kilometers or over.

[Second Mode of Carrying Out]

The external direct current source was removed from the circuit in FIG. 2 according to the first mode of carrying out. Applying thereafter the temperature difference of about 80° C. between the ends of the first thermoelectric converter element 10 and the second thermoelectric converter element 20 (namely, the joint member d13 and the joint member d23) verified that an electromotive force of 0.2 mV is caused to a terminal of the thus removed external direct current source. It was verified that the first thermoelectric converter element 10 on a cool side and the second thermoelectric converter element 20 on a heat side which are so constituted as to be independent of each other can keep the Seebeck effect.

Figure 7:
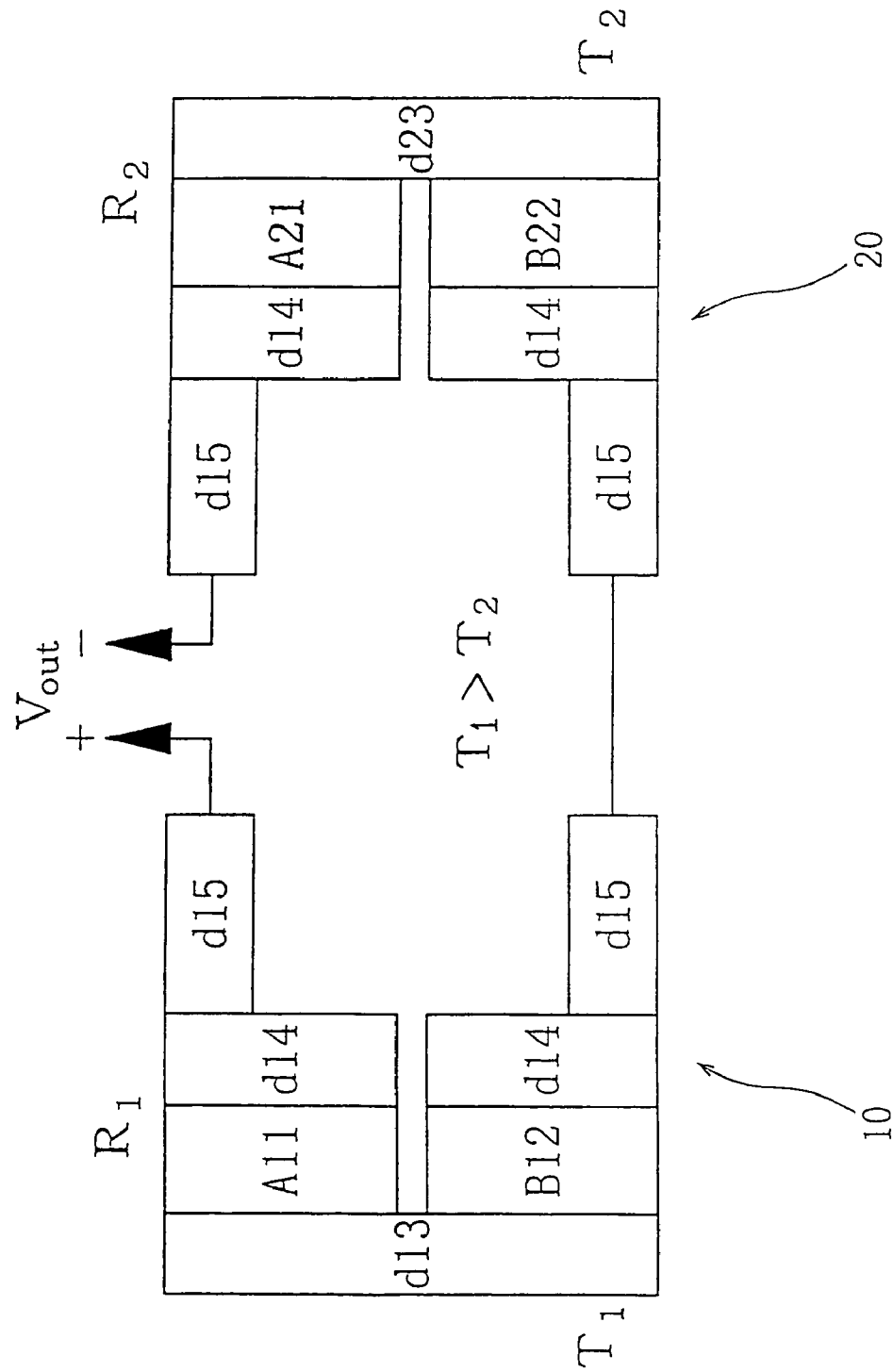
FIG. 7 shows a schematic for explaining a circuit system converting a heat energy into an electric potential energy by a pair of Peltier effect elements capable of setting a certain distance, according to a second mode for carrying out.

FIG. 7 relates to a second mode of carrying out. FIG. 7 shows a schematic for explaining a pair of Peltier effect heat transfer circuit systems capable of setting up a certain distance between two thermoelectric converter elements. According to the second mode of carrying out, parts and sections substantially the same as those according to the first mode of carrying out are to be denoted by the same numerals and/or signs and specific explanation therefor is to be omitted.

The circuit system in FIG. 7 is constituted in the following manner: remove the external direct current source from the circuit system like the one in FIG. 2; adjust the length of the electric conduction material in such a manner as to keep the first thermoelectric converter element 10 and the second thermoelectric converter element 20 at least free from the mutual thermal interference (for example, if necessary, from several microns to several hundred kilometers); and cut a part of the electric conduction material as to form an output voltage terminal. In the circuit system in FIG. 7, the end (the joint member d13) of the first thermoelectric converter element 10 and the end (the joint member d23) of the second thermoelectric converter element 20 are disposed in ambient temperatures different from each other. Keeping ambient temperature difference "T1–T2" (between an ambient temperature T1 and an ambient temperature T2) finite can convert the heat energies in different ambiences directly into an electric potential energy by the Seebeck effect, and can make the heat energy usable as a power source.

In the circuit so constituted as is seen in FIG. 7, the general π-shaped pn junction element is used for the first electric conductor member A11 and the second electric conductor member B12, likewise, the general π-shaped pn junction element is used for the first electric conductor member A21 and the second electric conductor member B22. The distance {length of the electric conduction material (copper)} between the first thermoelectric converter element 10 and the second thermoelectric converter element 20 is set at 1 m. The following steps were taken: cut a part of the electric conduction material (for example, a middle section of one of the electric conduction materials); use a voltage meter for measuring the voltage output (by the Seebeck effect) at the thus cut part, while externally heat and externally cool, respectively, an endothermic terminal and an exothermic terminal at the ends (end of the first thermoelectric converter element 10 and end of the second thermoelectric converter element 20, respectively, in other words, the respective joint member d13 and joint member d23) of the two π-shaped pn junction elements, thus measuring an output voltage plus an output voltage minus. Moreover, it was verified that heating the exothermic terminal and cooling the endothermic terminal can reverse the output voltage pulse with the output voltage minus.

Herein, the Seebeck effect is for transferring the temperature difference directly to the electric potential energy. Securing the distance for keeping at least T1>T2 can bring about the Seebeck effect. The thus secured distance is, however, preferable such that the first thermoelectric converter element 10 and the second thermoelectric converter element can be kept free from the mutual thermal interference. For example, provided that the first thermoelectric converter element 10 and the second thermoelectric converter element 20 are kept at least free from the mutual thermal interference, the distance of the electric conduction material can theoretically be set at several microns (minor) to several hundred kilometers or over.

[Third Mode of Carrying Out]

According to a third mode of carrying out, a specific constitution for achieving an object of the present invention is to be explained based on a fundamental technical concept of the present invention (the above specific constitution is, for example, the constitutions according to the first mode of carrying out and the second mode of carrying out). Hereinafter, a conductor or a semiconductor is referred to as "electric conductor member," while a joined electric conduction material is referred to as "endothermic terminal" or "exothermic terminal." The endothermic section is otherwise referred to as "negative energy source," while the exothermic section is otherwise referred to as "positive energy source."

For achieving the above object, like the first mode of carrying out and the second mode of carrying out, the first electric conductor member A11 and the second electric conductor member B12 which have different Seebeck coefficients from each other are joined via the joint member d13 thus forming the first thermoelectric converter element 10. Like the formation of the first thermoelectric converter element 10, the first electric conductor member A21 and the second electric conductor member B22 which have different Seebeck coefficients from each other are joined via the joint member d23 made of the material featuring good thermal conductivity and good electric conductivity (for example, copper, gold, platinum, aluminum and the like), thus forming the second thermoelectric converter element 20. Moreover, by way of electric conduction materials (for example, wiring materials made of copper, gold, platinum, aluminum and the like) featuring good thermal conductivity, the first electric conductor member A11's side opposite to the joint member d13 and the second electric conductor member B12's side opposite to the joint member d13 are connected, respectively, to the first electric conductor member A21's side opposite to the joint member d23 and the second electric conductor member B22's side opposite to the joint member d23. Connecting a part of the above electric conduction material (for example, a middle section of one of the electric conduction materials) to a direct current in-line may constitute a pair of the Peltier effect heat transfer circuit systems with the joint member d13 on the endothermic side and the joint member d23 on the exothermic side.

The above electric conduction material may be in need of having such a length as to keep the first thermoelectric converter element 10 and the second thermoelectric converter element 20 at least free from the mutual thermal interference. Theoretically, setting the above length is variable from several microns (minor) to several hundred kilometers or over.

Defining the certain distance for separating, by using the electric conduction material featuring good thermal conductivity, the electric conductor members constituting the Peltier effect element and the Seebeck effect element was not conventionally taken into account at all. The heat energy transfer in the above constitution is based on the following physical mechanism as a principle: Even the distance between the endothermic side and the exothermic side in the circuit system is great, the heat energy can be transferred momentarily by the electronic heat insulation phenomenon (detailed above) and a current flowing at an electromagnetic wave speed in the conductor featuring good thermal conductivity.

A mechanism of the heat energy transfer can be conjectured as follows: Instead of a group of in-conductor free electrons, a slight movement caused when the group of the free electrons electromagnetically moves an adjacent group of electrons may transfer a group of electrons at an electromagnetic wave speed in the electric conduction material, thus transferring the heat energy. Physically, exothermy (calorification) and endothermy in the circuit system may be caused independently of each other in different places. Pursuant to the current continuity law in the electric circuit system, however, a current I flowing through the endothermic section and the exothermic section in the same amount may consequently cause an endothermic energy and an exothermic energy in the same amount, establishing the energy conservation law.

Figure 8:
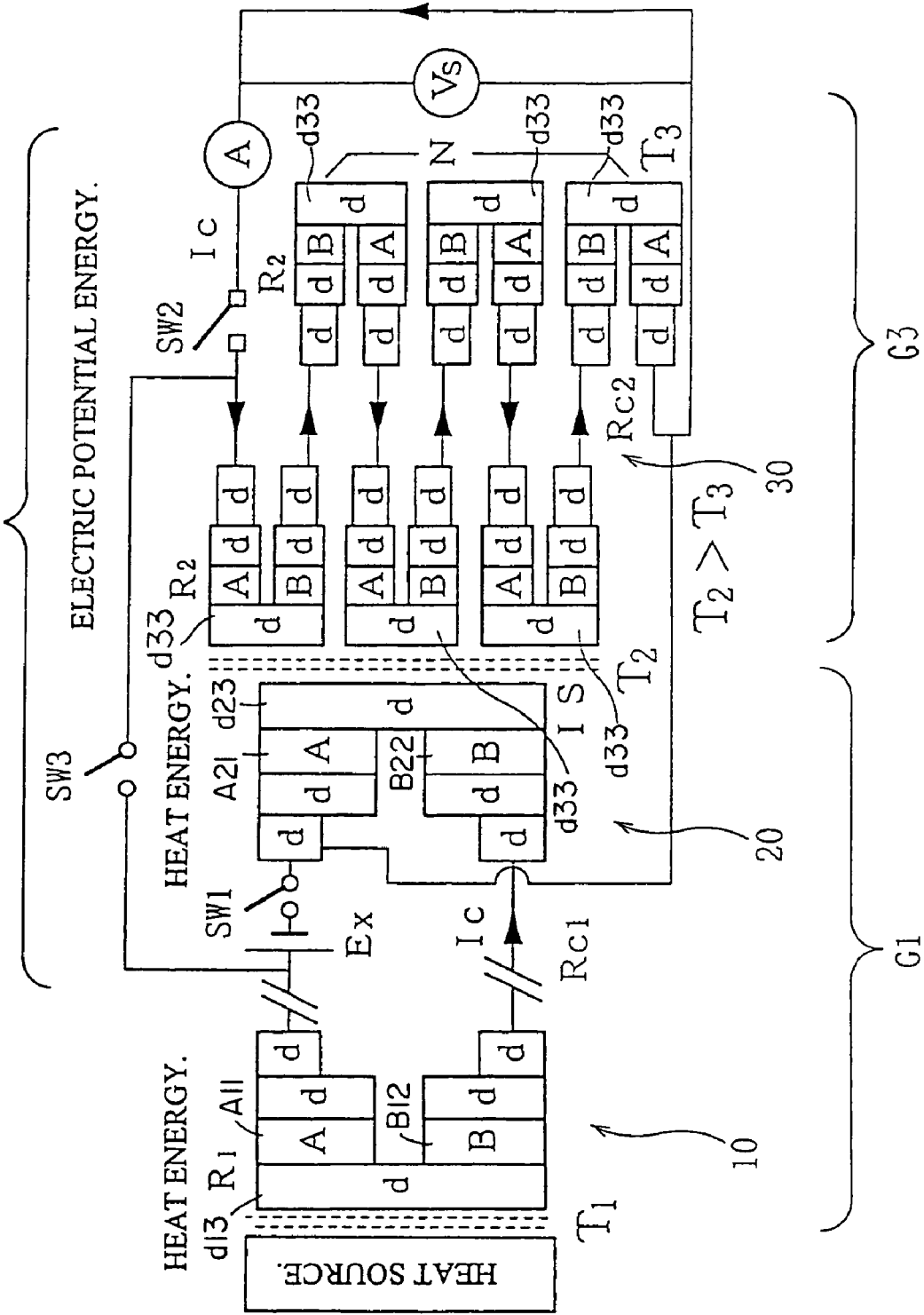
FIG. 8 shows a schematic of a circuit of a self-driving heat transfer system, for explaining the energy direct conversion system using the thermoelectric effect device, according to a third mode of carrying out.

FIG. 8 shows a schematic of a circuit of a self-driving heat transfer system, for explaining the energy direct conversion system using the thermoelectric effect device, according to the third mode of carrying out. FIG. 8 shows a voltage output Vs, a circuit resistance Rc1, a circuit resistance Rc2, and a circuit current Ic. Moreover, FIG. 8 shows a third thermoelectric converter element 30 like the first thermoelectric converter element 10 and the second thermoelectric converter element 20. The above members in FIG. 8 are also applicable likewise to the latter modes of carrying out. The self-driving heat transfer system can be operated in the following steps, namely, the above constitution can be operated in the following manner.

1. Turn on a first switch SW1 of a heat energy transfer section 31. Then, use an external direct current source EX, for transferring the heat energy from a heat source side to a power feedback section G2 at a certain distance by means of the heat energy transfer section G1 in the circuit system which uses the Peltier effect.

2. For increasing the output voltage by the Seebeck effect, heat a high temperature side of the power feedback section G2 to the ambient temperature T2, with the heat energy transferred by way of an insulator material IS (for example, silicone oil, a metal with its surface coated with alumite, insulation sheet, and the like) featuring good thermal conductivity and good insulation. Hereinabove, the power feedback section G2 is constituted such that a plurality of the third thermoelectric converter elements 30 {2n pieces (n: natural number); 6 pieces in FIG. 8} are connected in-line into a multiple of steps. On the other hand, cool a low temperature side of the power feedback section G2 to an ambient temperature; or cool, if necessary, the ambient temperature to an ambient temperature T3 by air or water; so as to keep "T2>T3." As described above, using 2n pieces of the third thermoelectric converter elements for the power feedback section G2 can bring about n pieces of the Peltier effect heat transfer circuit systems.

3. Turn on a second switch SW2 and a third switch SW3, while turn off the first switch SW1. Cut the external direct current source EX. Use the power feedback section G2 for positively feedbacking to the heat energy transfer section G1 an output voltage caused at a power generator section G3, thus keeping current flow to the circuit system which uses the Peltier effect at the heat energy transfer section G1 and further thus keeping simultaneously therewith the heat energy transfer.

4. The circuit system in FIG. 8 is thermodynamically operated in an open system. Therefore, "the entropy increase law that can be established only in a closed system" is not applicable to the above circuit system. In addition, the circuit system is not scientifically an impossible system such as the perpetual motion.

Figure 9:
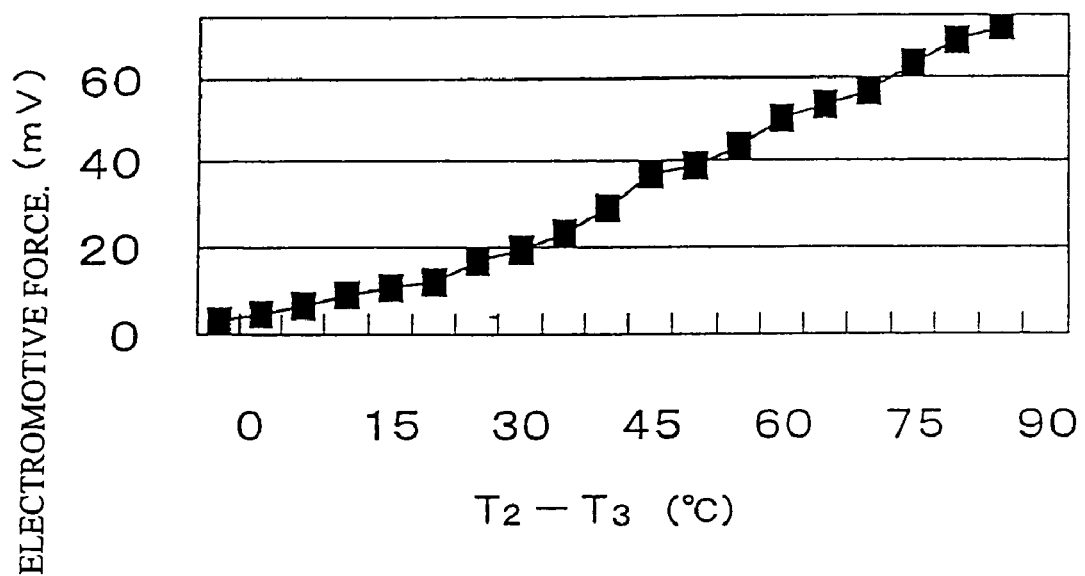
FIG. 9 shows an electromotive force relative to change in temperature difference.

For checking the Seebeck effect in the power generator section G3 in FIG. 8, an electromotive force corresponding to a difference "T2−T3" between the ambient temperature T2 and the ambient temperature T3 was measured. As is seen in FIG. 9, it was verified that the larger the "T2−T3" is, the greater the electromotive force is obtained. In other words, in the circuit system in FIG. 8, keeping the difference "T2−T3" between the ambient temperature T2 and the ambient temperature T3 can more efficiently cause and keep the electromotive force by the Seebeck effect.

[Fourth Mode of Carrying Out]

Figure 10:
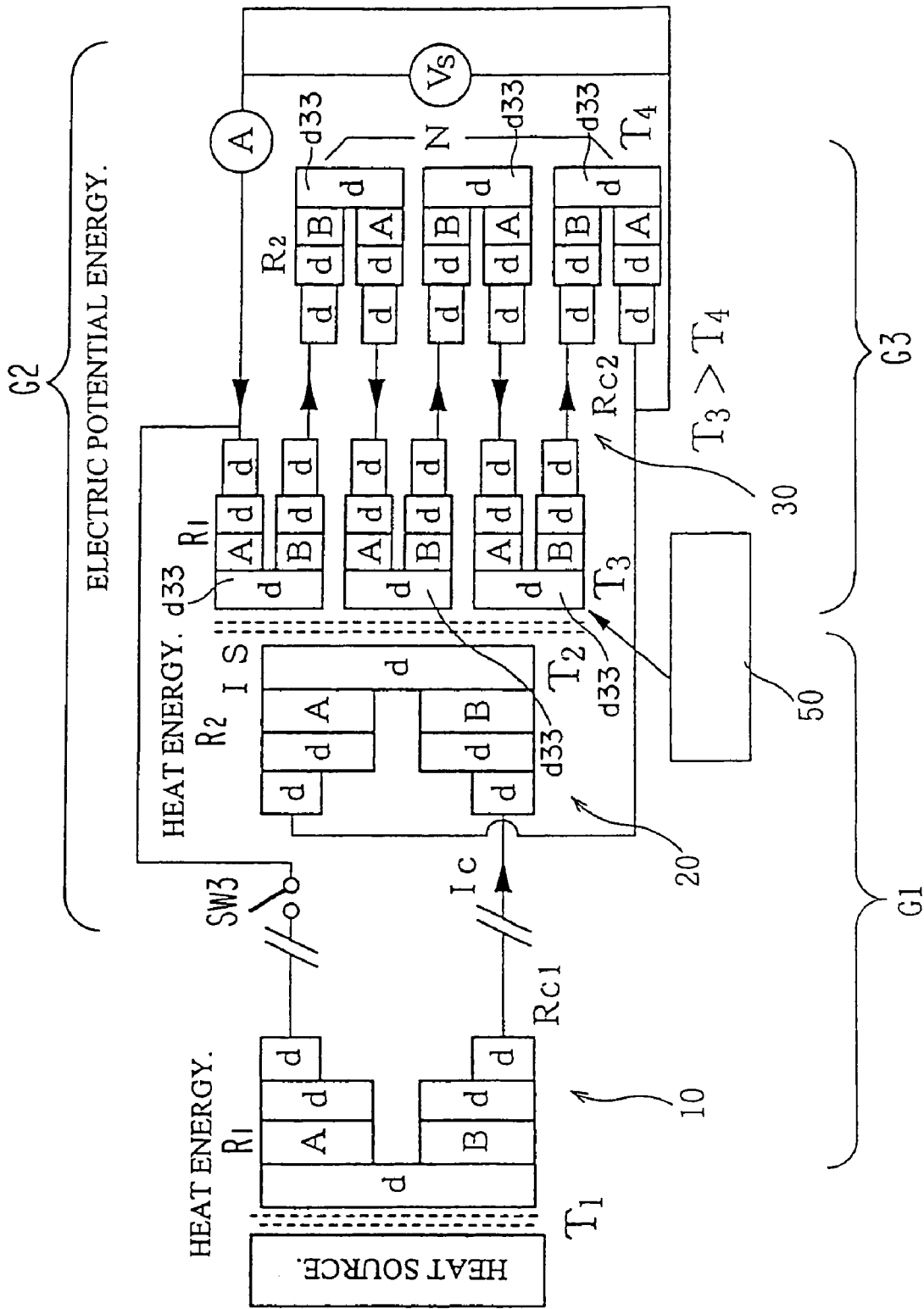
FIG. 10 shows a schematic of a circuit of a self-driving heat transfer system, for explaining the energy direct conversion system using the thermoelectric effect device, according to a fourth mode of carrying out.

FIG. 10 shows a schematic of a circuit of a self-driving heat transfer system, for explaining the energy direct conversion system using the thermoelectric effect device, according to a fourth mode of carrying out. The self-driving heat transfer system in FIG. 10 is more improved than its counterpart in FIG. 8. The above improved system can be operated in the following steps.

1. Turn on the third switch SW3, so that the output voltage of the circuit can constitute the power feedback section G2 by a positive feedback to the Peltier effect heat transfer circuit system of the heat energy transfer section G1. Hereinabove, the circuit is constituted by connecting in-line a plurality of the third thermoelectric converter elements 30 (6 pieces in FIG. 10) of the power generator section G3 by the Seebeck effect into a multiple of steps.

2. In the power generator section G3, if necessary, use a combustion (wood and the like) or an auxiliary heater 50 (a small heater device and the like) for heating the high temperature side of the Seebeck circuit system to the ambient temperature T3. On the other hand, cool the low temperature side of the Seebeck circuit system to the ambient temperature, or cool the ambient temperature to an ambient temperature T4 by air or water, so as to keep "T3>T4."

3. After checking the following, stop an external heating of a section of the ambient temperature T3, namely, turn off the auxiliary heater 50 used for the external heating: The positive feedback described in point 1 above has allowed the current to flow in the Peltier effect heat transfer circuit system of the heat energy transfer section G1, thus transferring the heat energy. Then, the thus transferred heat energy increases the ambient temperature T2 to such an extent that the ambient temperature T2 becomes substantially equal to the ambient temperature T3.

4. With an initial energy applied locally to the circuit system in FIG. 10, the circuit system in FIG. 10 can consume less energy than the circuit system in FIG. 8 which initially loses the Joule heat in the Peltier effect heat transfer circuit system. Especially, the circuit system in FIG. 10 can show a remarkable effect when it has a large scale with the heat energy transfer distance (of the Peltier effect heat transfer circuit system) from several ten kilometers to several hundred kilometers or over.

[Fifth Mode of Carrying Out]

Figure 11:
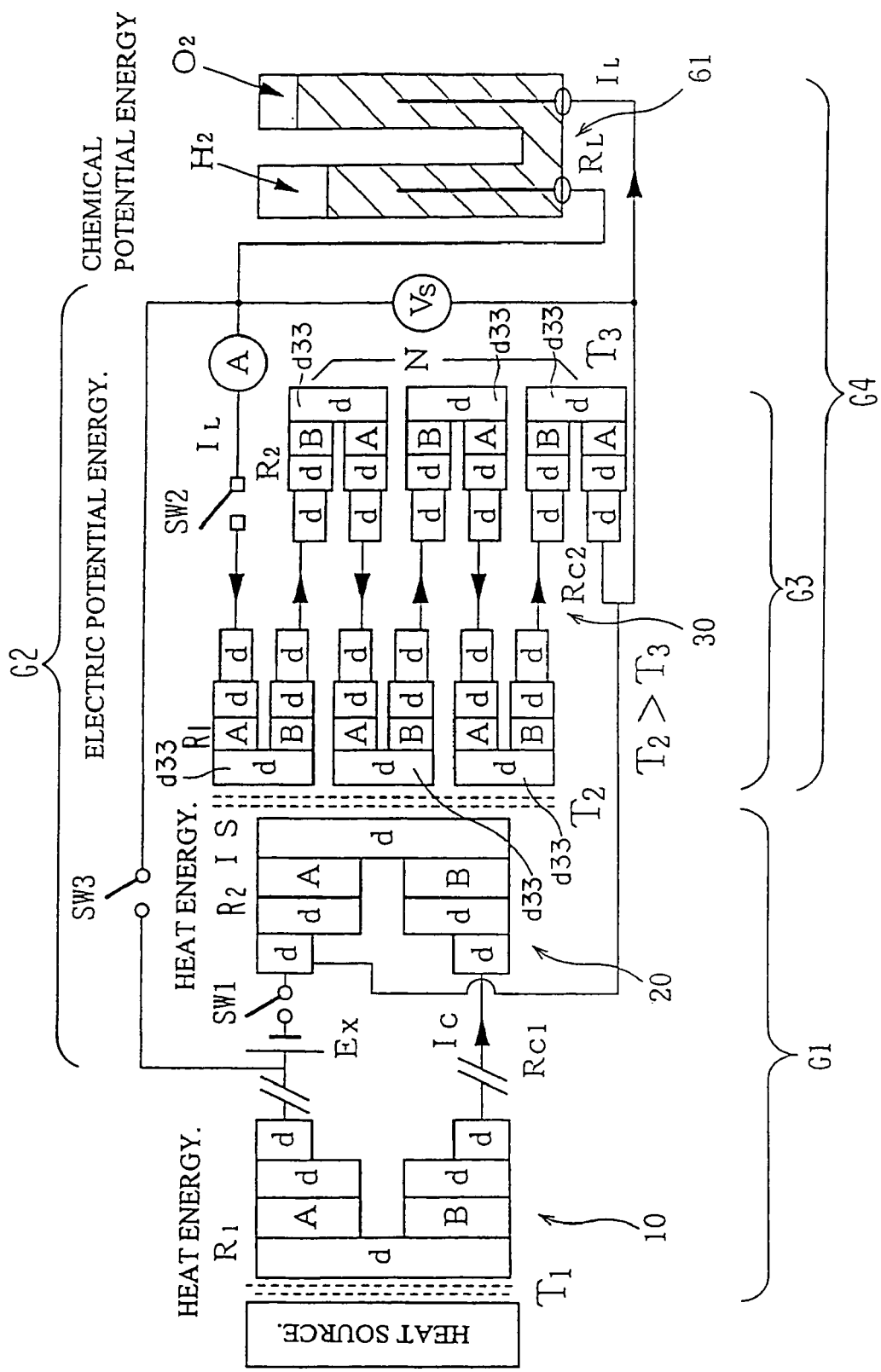
FIG. 11 shows a schematic of a circuit of a self-driving heat transfer system, for explaining the energy direct conversion system using the thermoelectric effect device, according to a fifth mode of carrying out.

FIG. 11 shows a schematic of a circuit of a self-driving heat transfer system, for explaining the energy direct conversion system using the thermoelectric effect device, according to a fifth mode of carrying out. The external direct current source of the self-driving heat transfer system in FIG. 11 is more improved than its counterpart in FIG. 8. More specifically about this: The third thermoelectric converter element 30 is attributable to the Seebeck effect in the circuit system using the external direct current source in FIG. 8. The power generator section G3 is so constituted as to connect in-line a plurality of the third thermoelectric converter elements 30 into a multiple of steps. The third thermoelectric converter element 30 has an output end (of the output voltage) which is fitted with a load circuit 61 disposed in parallel with a positive feedback circuit. The load circuit 61 is, for example, an electrolysis device for converting, through a water electrolysis, the electric potential energy into a chemical potential energy of a hydrogen gas ($H_2$) and an oxygen gas ($O_2$). FIG. 11 also shows a load current $I_L$ and a load resistance $R_L$ which are to be used likewise in the latter modes for carrying out. An electrolysis device used for the load circuit 61 is one generally commercialized.

According to the fifth mode of carrying out, the electric potential energy caused to the power generator section G3 is usable after being converted into the chemical potential energy of the hydrogen gas ($H_2$) and the oxygen gas ($O_2$) by means of a water electrolysis device disposed in an electrolysis section G4.

In terms of constitution, the heat energy transfer section G1 and the power generator section G3 are like their counterparts in FIG. 8, and therefore specific explanation thereabout is to be omitted. According to the fifth mode of carrying out, converting the electric potential energy into the chemical potential energy can secure the energy that is easy to pressurize, compress, store, accumulate, and convey.

[Sixth Mode of Carrying Out]

Figure 12:
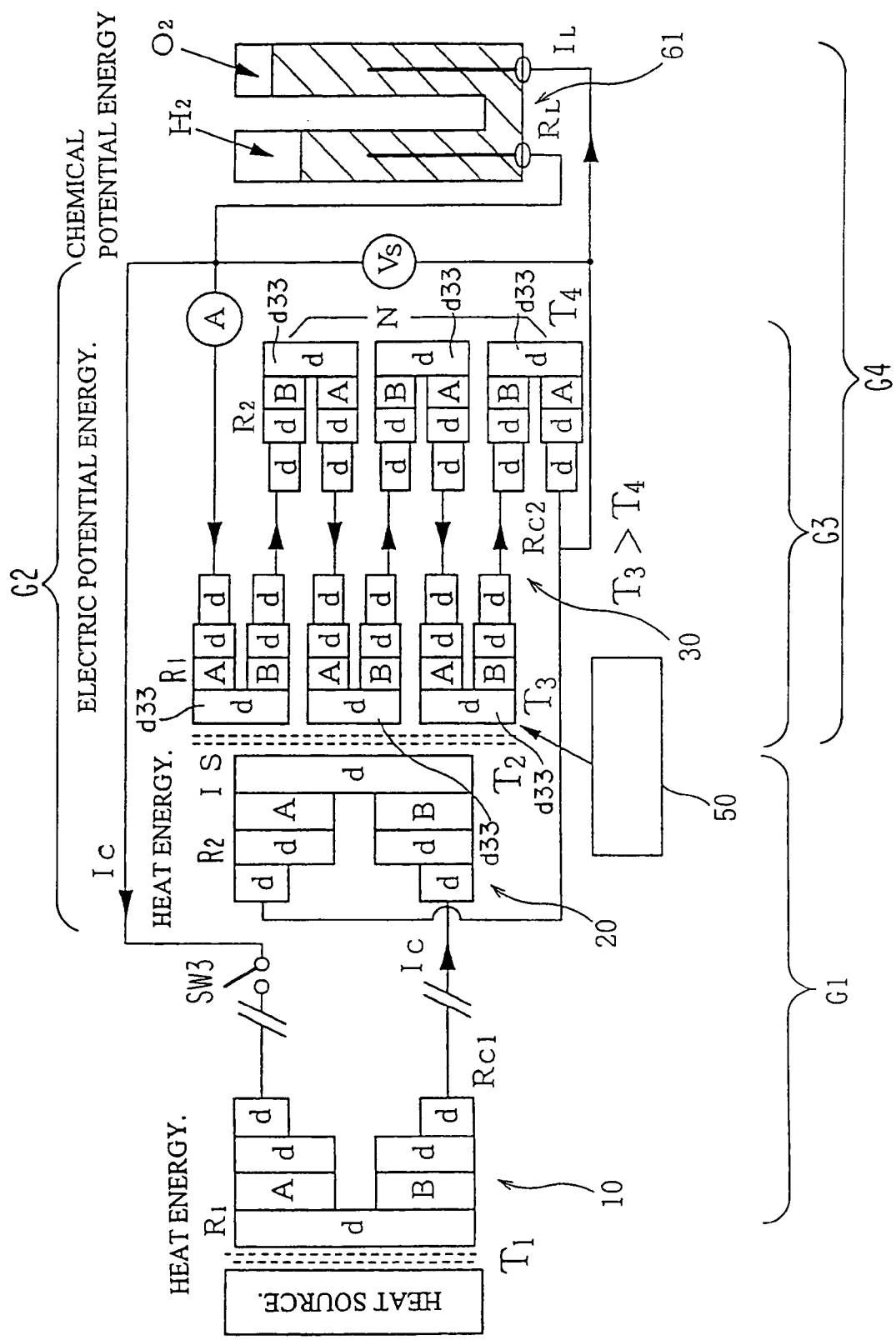
FIG. 12 shows a schematic of a circuit of a self-driving heat transfer system, for explaining the energy direct conversion system using the thermoelectric effect device, according to a sixth mode of carrying out.

FIG. 12 shows a schematic of a circuit of a self-driving heat transfer system, for explaining the energy direct conversion system using the thermoelectric effect device, according to a sixth mode of carrying out. Like the electrolysis section G4 in FIG. 11, the electrolysis section G4 in FIG. 12 is provided as a specific example of the load circuit of the self-driving heat transfer system which is the improved version of its counterpart in FIG. 10. The circuit system in FIG. 12 is the system in FIG. 10 added by the electrolysis section G4 (of electrolyzing water) using the chemical potential energy. More specifically about this: The circuit system in FIG. 12 is a self-driving heat transfer system that is effective for using in common the transferred heat energy, the power, and the chemical potential energy which is brought about by electrolyte, water electrolysis and the like. Setting the thus improved self-driving heat transfer system in FIG. 12, for example, in Japan and other regions all over the world may vitalize regional economy as well as regional food production, and simultaneously may decelerate global warming and suppress environmental disruption, thanks to the energy brought about by the self-driving heat transfer system. Realization of the above is obviously a significant subject for supporting the human beings increased to 2.1 billion and other lives.

[Seventh Mode of Carrying Out]

Figure 13:
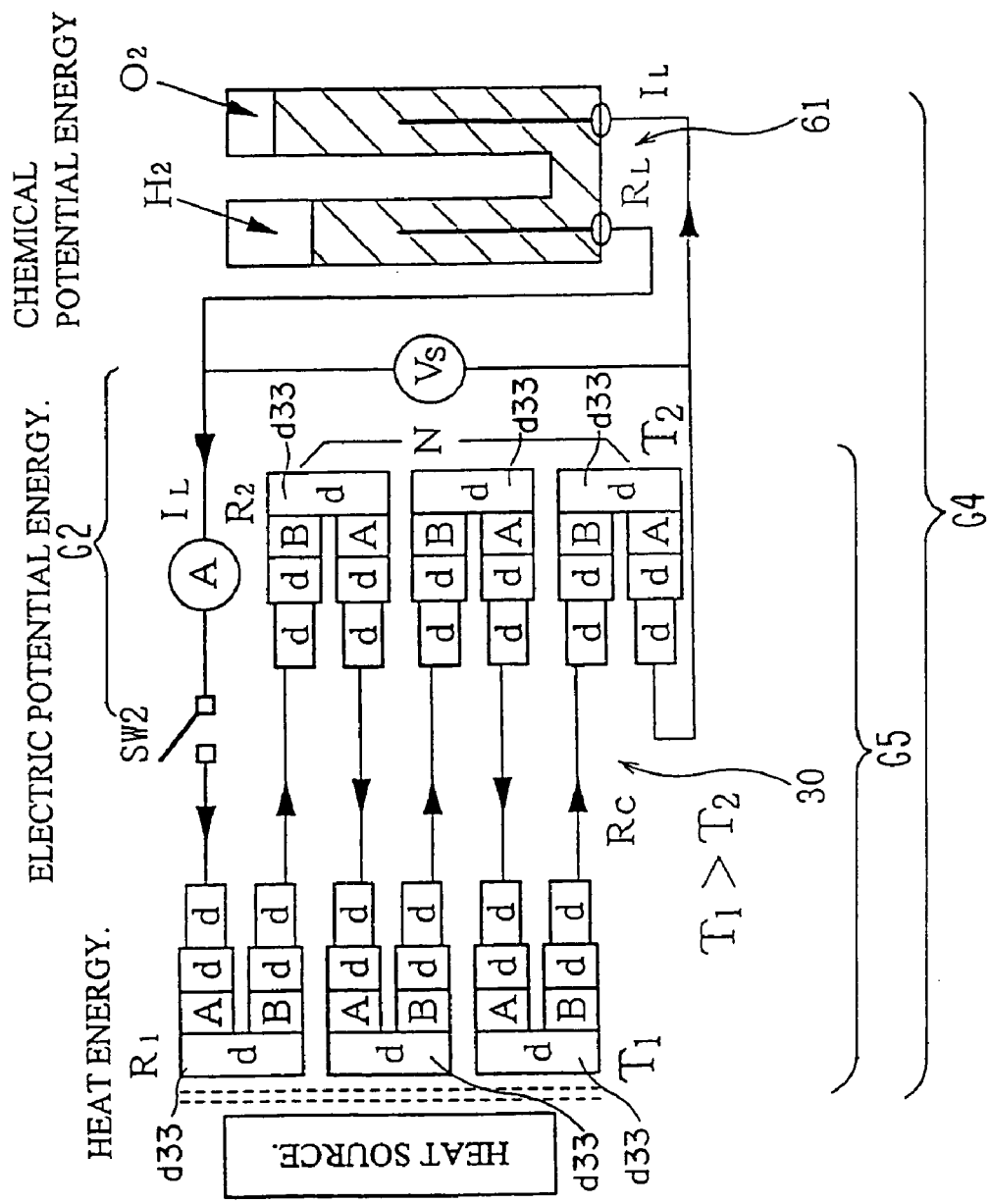
FIG. 13 shows a schematic of a circuit of a self-driving heat transfer system, for explaining the energy direct conversion system using the thermoelectric effect device, according to a seventh mode of carrying out.

FIG. 13 shows a schematic of a circuit of a self-driving heat transfer system, for explaining the energy direct conversion system using the thermoelectric effect device, according to a seventh mode of carrying out. Without the Peltier effect heat transfer circuit system, the system according to the seventh mode of carrying out may directly convert the heat energy (from the heat source) into the electric potential energy. The above direct conversion is carried out in a circuit where a plurality of the third thermoelectric converter elements 30 are connected in-line into a multiple of steps in a heat energy direct power converter section G5 by the Seebeck effect. At the output voltage end, the electrolysis section G4 (of electrolyzing water) for converting into the chemical potential energy through the water electrolysis is provided as a specific example of the load circuit. According to the seventh mode of carrying out, the direct conversion circuit system capable of the self-driving can bring about the electric potential energy and the chemical potential energy from the heat energy.

From the constitutions in FIG. 2, FIG. 7, FIG. 8, FIG. 10 to FIG. 13 described above, the certain distance can be defined between the endothermic section and the exothermic section, or between the heating section and the cooling section. With this, the heat energy or the electric potential energy can be transferred at a short distance (for example, several microns) or at a long distance (for example, several hundred kilometers), thus establishing an energy source system (recycle type) capable of reusing the omnipresent natural heat energy which is free from causing environmental pollution.

The electric conductor member constituting the thermoelectric effect element according to the first mode of carrying out through the seventh mode of carrying out includes, for example, a solid solution of $Bi_2Te_3$, $Bi_2Se_3$, $Sb_2Te_3$ and the like as low temperature (room temperature) thermoelectric material; an alloy of SiGe derivative, derivatives of $Ce_3$, $Te_4$, $La_3Te_4$, $Nd_3Te_4$, and the like as high temperature (over 1000 K) thermoelectric material; and multiple-element compound (derivatives of PbTe, AgSb, and Te—GeTe) and $Mg_2Ge$—$Mg_2Si$ derivative as medium temperature thermoelectric material. Use of the proper electric conductor member referring to operation ambience is preferred.

A p type electric conductor member and an n type electric conductor member constituting a pair of thermoelectric effect elements can be made of the same material or different materials. Combination of the materials is selectable, referring the operation ambience.

Described next is more specific embodiment concerning the energy direct conversion system using the thermoelectric converter element and the thermoelectric effect device which is the energy source system (recycle type).

FIRST EMBODIMENT

Figure 14:
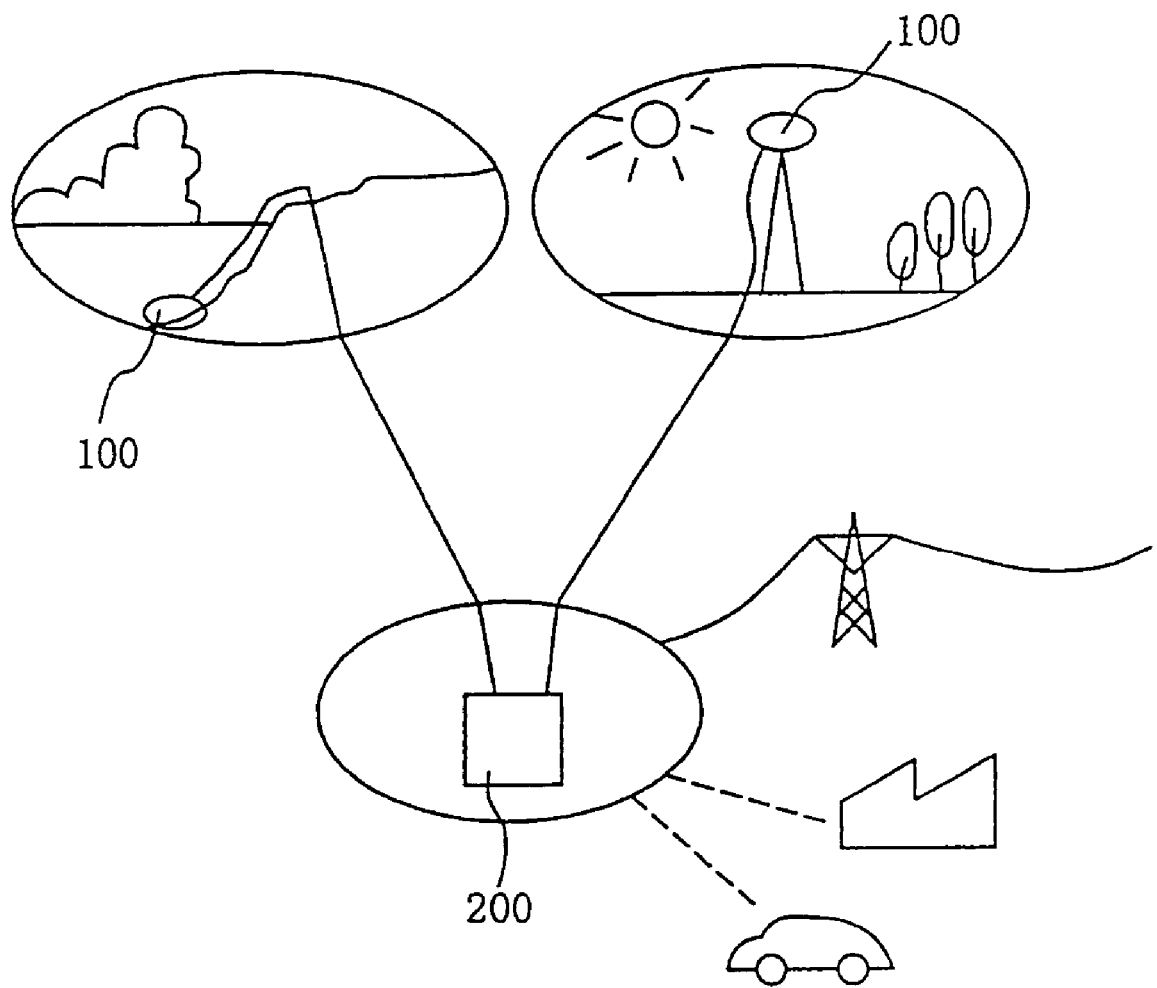
FIG. 14 explains a first embodiment (large scale) under the present invention.

FIG. 14 explains a first embodiment (large scale) under the present invention, showing a specific example of a social energy supply infrastructure. FIG. 14 shows a thermoelectric effect device 100 (endothermic side) and a thermoelectric effect device 200 (exothermic side).

(1) Sea water about 10 m below water level continuously flowing at a stable temperature (constant temperature) can become a stable heat energy source. Therefore, disposing the thermoelectric effect device 100 (endothermic side in a group of Peltier effect elements) in the sea water and disposing the thermoelectric effect device 200 (exothermic side in the group of Peltier effect elements) on the ground may carry out a long distance heat energy transfer (namely, heat energy of the sea water) to the group of the Peltier effect elements (exothermic side), according to the first mode of carry out described above. Adhering the group of the Seebeck effect elements to the group of the Peltier effect elements (exothermic side) can convert the thus transferred (long distance) heat energy into the electric potential energy, according to the second mode of carrying out through the fourth mode of carrying out, thus enabling an electric power generation all through the year. With this, an electric power generator free from causing environmental pollution can be constructed in various regions all over Japan.

(2) River water can replace the sea water in (1) above. More specifically about this: The heat energy in the river water is transferred at medium distance by the above means used for the long distance. Then, adhering the group of the Seebeck effect elements to the Peltier effect elements (exothermic side) can convert the thus transferred (medium distance) heat energy into the electric potential energy. With this, the electric power generator can be constructed in the various regions.

(3) Heat energy from ground or hot spring drainage can replace the sea water and the river water, thus constructing the electric power generator in the various regions.

(4) Electrolyzing the above water with the electric power caused by the electric power generator in each of (1), (2), and (3) above can convert the electric potential energy into the chemical potential energy (hydrogen gas and oxygen gas), according to the fifth mode of carrying out through the seventh mode of carrying out. Compressing each of the hydrogen gas and the oxygen gas which contain therein the chemical potential energy and storing each of the above gases in a bomb and the like can make it easy to convey the above gases, thus enabling supply and accumulation of chemical potential energy source in the various regions. Reacting again the hydrogen with the oxygen can make a conversion into dynamic energy or propelling energy, or the hydrogen thus reacted with the oxygen can be used for hydrogen cell, thus achieving an active use of the energy.

(5) Waste (product) which may be brought about after the use of the chemical potential energy of the hydrogen and the oxygen is water, thereby causing substantially no environmental load as environmental pollution.

(6) The environmental energy source used in (1) to (5) above is a part of the conversion from the sun light (from sun to earth) into the heat energy, and is thereby to be discharged from the earth as a radiation energy. According to the above first embodiment, it is a part of a solar energy that is used, in other words, "use of recyclable endurable energy."

Other than the thermoelectric effect device 100 (endothermic side) described above, the thermoelectric effect device 100 obtaining the heat energy directly from the sun light in FIG. 14 is usable.

SECOND EMBODIMENT

Figure 15:
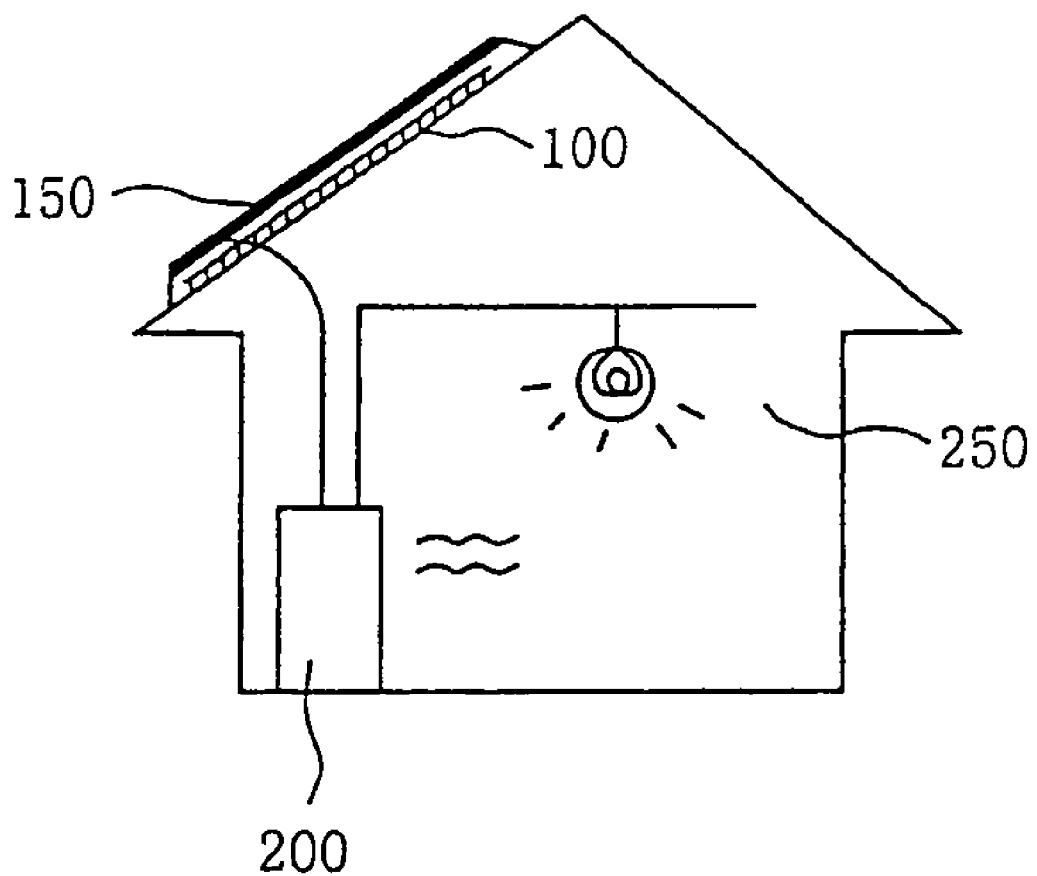
FIG. 15 explains a second embodiment (medium scale) under the present invention.

FIG. 15 explains a second embodiment (medium scale) under the present invention, showing a specific example of an energy supply system in a residential house. FIG. 15 shows the thermoelectric effect device 100 (endothermic side), a solar battery 150, the thermoelectric effect device 200 (exothermic side), and an illumination appliance 250.

(1) Reflecting most of the solar energy, the solar battery 150 has an element that may not be able to use the solar energy effectively. Therefore, on a house top and the like, a black material can replace the solar battery 150. Then, the thermoelectric effect device 100 (endothermic side) is to be disposed beneath the black material. With the above constitution, a black body energy can be absorbed, thus converting most of the solar energy into the heat energy. The thus converted heat energy is then to be absorbed by the circuit system of the group of the Peltier effect elements, according to the first mode of carrying out, thereby transferring the heat energy to the exothermic side disposed at a medium distance. The thus transferred heat energy can be used depending on object, including a heater, heating equipment and the like. According to the second embodiment, a large scale external electric power source is not necessary, namely, the energy from the sun light can be converted into the heat energy to be used in various forms.

The second embodiment in FIG. 15 shows use of the heat energy in the daytime, with the temperature higher outside than inside. At night, for example, the temperatures are reversed. Therefore, the energy supply system in FIG. 15, for example, may be of switching type. More specifically, operating a switching element: 1) with a sensor for sensing temperature changes outside and inside or 2) by resident's will and the like can switch the endothermic side (of the energy supply system) with the exothermic side (of the energy supply system), thus making a preferred heat energy conversion.

(2) Reversing the current direction of the circuit system having a pair of the Peltier effect elements defining therebetween an interval can switch the endothermic side with the exothermic side, without replacement and the like of a circuit part. Disposing outside the exothermic side and disposing inside the endothermic side can constitute an air cooler or an ice producer each of which does not need a large scale external electric power source (in other words, using the improved Peltier effect heat transfer device under the present invention can make an air conditioner without the external electric power source).

(3) Like the first embodiment in FIG. 14 (large scale), adhering the group of the Seebeck effect elements to the exothermic side to which the heat energy is transferred can convert the heat energy into the electric potential energy, according to the second mode of carrying out through the fourth mode of carrying out. With this, disposing a medium scale generator in the various regions and at home is possible.

(4) Water electrolization with the medium scale generator can convert the electric potential energy into the chemical potential energy according to the fifth mode of carrying out through the seventh mode of carrying out, thus bringing about storable and conveyable hydrogen and oxygen. Like the large scale generator according to the first embodiment, in the various regions, the medium scale generator according to the second embodiment can establish a system by using the chemical potential energy depending on the object.

THIRD EMBODIMENT

Air surrounding daily life is expected to have some heat energy, provided that the air's temperature is not an absolute zero Kelvin. Use of the heat energy of the air surrounding the daily life can be described as follows, according to a third embodiment (small scale).

(1) The group of the Peltier effect elements (endothermic side) and the group of the Peltier effect elements (exothermic side) are so properly disposed as to be kept free from the mutual thermal interference. The thus disposed two groups of the Peltier effect elements are usable independent of each other. According to the first mode of carrying out, the cool side is to be disposed in the air conditioner (in residential house), a refrigerator or a freezer, while the exothermic side is to be disposed in a hot water vessel, a pot or a cooking heater. With the above disposition, the cooling device and the heating device in residential house can be used in a pairwise form, without the external electric power source (In this case, to allow use of various devices having a pair of the cooling and the heating in residential house, the improved Peltier effect heat transfer circuit system can eliminate the need of the external electric power.).

(2) Moreover, miniaturizing the two groups of the energy effect elements described above can form into a portable type. Various devices having a pair of cooling and heating such as 1) a small refrigerator and 2) pot or heat-cooking device can be produced, for example, for outdoor use or camping site.

(3) How to remove unnecessary heat contained in: 1) a computer or a personal computer (large, medium and small), 2) small power source device, and 3) solid, liquid and gas; and how to use the removed unnecessary heat are described as follows.

(4) In the computer, for example, a central processing unit (CPU) element is a great exothermic source during operation. Removing the heat caused by the CPU element presently uses a cooling thermo-module (having thickness of 1 cm or below) that uses the Peltier effect element. Adhering the endothermic side to the CPU element and mounting a radiator plate and a small heat removal fan to the exothermic side can cause a reinforced heat wasting, thus causing power waste and turbulent noise, resulting in an avoidable inconvenience.

Under the present invention, the electric conduction material featuring good thermal conductivity is used for separating the endothermic side from the exothermic side of the Peltier effect element. The above electric conduction material is, for example, from several ten centimeters to several meters in accordance with the scale of the computer. With this, the endothermic side is adhered to the CPU element, while the exothermic side is adhered to a computer box (having a large surface) or to an external radiation metal body or is mounted to the hot water vessel, thus removing the heat without noise and saving the electric power simultaneously with the removal.

Under the present invention, use of the improved Peltier effect heat transfer circuit system eliminating the need of the external electric power source can produce, other than the computer, the small power source device and a small device which removes and uses unnecessary heat contained in solid, liquid, and gas.

Hereinafter described are other applications under the present invention. In the case of liquid: An automatic vendor vending both cold drink and hot drink has the endothermic side of the Peltier effect element on the cold drink side while the exothermic side of the Peltier effect element on the hot drink side, thus drastically decreasing consumption of the external electric power. Another automatic vendor using the improved Peltier effect heat transfer circuit system can be developed that is in no need of the external electric power.

In the case of gas: Making a pair of a cooing device (a fish display at fish monger, a refrigerator at a butcher, and the like) and a heating device which corresponds to the cooling device can constitute an energy recycle device requiring low energy and making environmental pollution free. The above energy recycle device can make cooling, preservation, heating, heat insulation, and the like.

All the embodiments using the improved Peltier effect heat transfer circuit system under the present invention can provide: "an open energy recycle system which . . . transfers the heat energy based on the natural heat energy and makes various energy conversions," and "a system which decelerates global warming and is substantially free from environmental load causing the environmental pollution."

Under the present invention, only the specific examples have been described above. Variations and amendments may occur to those skilled in the art within the range of the technical concept under the present invention. The above variation and amendments are, as a matter of course, within a scope of claims.

The invention claimed is:

1. A thermoelectric effect device, comprising:
   a first thermoelectric converter element and a second thermoelectric converter element, wherein each thermoelectric converter element comprises a first electric conductor member and a second electric conductor member which have different Seebeck coefficients from each other and a joint member that joins the first electric conductor member and the second electric conductor member,
   wherein the thermoelectric effect device is configured such that a side of the first electric conductor member of the first thermoelectric converter element that is opposite to the joint member of the first thermoelectric converter element is electrically connected via a first electric conduction material and a direct current source to a side of the first electric conductor member of the second thermoelectric converter element that is opposite to the joint member of the second thermoelectric converter element,
   wherein the side of the first electric conductor member of the first thermoelectric converter element and the side of the first electric conductor member of the second thermoelectric converter element face one another,
   wherein the thermoelectric effect device is configured such that a side of the second electric conductor member of the first thermoelectric converter element that is opposite to the joint member of the first thermoelectric converter element is electrically connected via a second electric conduction material to a side of the second electric conductor member of the second thermoelectric converter element that is opposite to the joint member of the second thermoelectric converter element, wherein the side of the second electric conductor member of the first thermoelectric converter element and the side of the second electric conductor member of the second thermoelectric converter element face one another, wherein each electric conduction material has such a length as to keep the first thermoelectric converter element and the second thermoelectric converter element at least free from a mutual thermal interference, wherein the direct current source is connected in-line via the first electric conduction material to the first and second thermoelectric converter elements constituting a Peltier effect heat transfer circuit system which has an endothermic section and an exothermic section, wherein the Peltier effect heat transfer circuit system is configured such that one of the first and second thermoelectric converter elements includes the endothermic section at a boundary between the joint member and the first electric conductor member and at a boundary between the joint member and the second electric conductor member of the one thermoelectric converter element, and an other of the first and second thermoelectric converter elements includes the exothermic section at a boundary between the joint member and the first electric conductor member and at a boundary between the joint member and the second electric conductor member of the other thermoelectric converter element, wherein the thermoelectric effect device is configured such that a distance is provided between the endothermic section and the exothermic section such that a temperature $T_\alpha$ at the endothermic section and a temperature $T_\beta$ at the exothermic section maintain a relation $T_\alpha<T_\beta$, and wherein the first thermoelectric converter element and the second thermoelectric converter element are arranged in the Peltier effect heat transfer circuit system such that the first electric conductor members and the second electric conductor members do not alternate with one another.

2. An energy direct conversion system using a thermoelectric effect device as claimed in claim 1, wherein the first thermoelectric converter element and the second thermoelectric converter element are disposed in ambient temperatures different from one another, and wherein the energy direct conversion system is configured to take out an electric potential energy from a predetermined section of the electric conduction materials to constitute a direct energy conversion electric circuit system to directly convert a heat energy into the electric potential energy.

3. The energy direct conversion system as claimed in claim 2, wherein, the energy direct conversion system further comprises:

at least a pair of the direct energy conversion electric circuit systems, and a plurality of starting sections using a temperature difference attributable to one of an initial external heating and an initial external cooling, wherein:

the energy direct conversion system converts a heat energy source directly into the electric potential energy, and wherein the heat energy source is in different ambient temperatures in different places independent of each other.

4. An energy conversion system using an energy direct conversion system as claimed in claim 3, wherein the energy conversion system obtains the electric potential energy by supplying to the energy direct conversion system the heat energy obtained from the thermoelectric effect device, and wherein the energy conversion system is configured to use a part of the electric potential energy as a direct current source of the energy conversion system by feeding back the part of the electric potential energy to the thermoelectric effect device.

5. The energy conversion system as claimed in claim 4, wherein the feedback of the electric potential energy is controlled by turning on and off a switch.

6. The energy conversion system as claimed in claim 4, wherein the feedback of the electric potential energy is controlled by turning on and off a switch, so that the electric potential energy is supplied to the thermoelectric effect device and that an electric power from the direct current source of the thermoelectric effect device is cut.

7. An energy conversion system, wherein: the energy conversion system converts the electric potential energy into a chemical potential energy through electrolization, the electric potential energy being obtained from the energy conversion system as claimed in claim 4.

8. An energy conversion system, wherein the energy conversion system converts the electric potential energy into a chemical potential energy through electrolization, the electric potential energy being obtained from the energy direct conversion system as claimed in claim 2.

9. An energy conversion system, using an energy direct conversion system as claimed in claim 2, wherein the energy conversion system obtains an electric potential energy by supplying to the energy direct conversion system the heat energy obtained from the thermoelectric effect device, and wherein the energy conversion system is configured to use a part of the electric potential energy as a direct current source of the energy conversion system by feeding back part of the electric potential energy to the thermoelectric effect device.

10. The energy conversion system as claimed in claim 9, wherein the feedback of the electric potential energy is controlled by turning on and off a switch.

11. The energy conversion system as claimed in claim 9, wherein the feedback of the electric potential energy is controlled by turning on and off a switch, so that the electric potential energy is supplied to the thermoelectric effect device and that an electric power from the direct current source of the thermoelectric effect device is cut.

12. An energy conversion system, wherein: the energy conversion system converts the electric potential energy into a chemical potential energy through electrolization, the electric potential energy being obtained from the energy conversion system as claimed in claim 9.

* * * * *